United States Patent
Shih et al.

(10) Patent No.: US 12,388,001 B2
(45) Date of Patent: Aug. 12, 2025

(54) ELECTRONIC PACKAGE

(71) Applicant: Advanced Semiconductor Engineering, Inc., Kaohsiung (TW)

(72) Inventors: Yu-Lin Shih, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 109 days.

(21) Appl. No.: 17/460,053

(22) Filed: Aug. 27, 2021

(65) Prior Publication Data

US 2023/0061843 A1 Mar. 2, 2023

(51) Int. Cl.
*H01L 23/31* (2006.01)
*H01L 23/498* (2006.01)
*H01L 23/00* (2006.01)

(52) U.S. Cl.
CPC .... *H01L 23/49833* (2013.01); *H01L 23/3157* (2013.01); *H01L 23/49822* (2013.01); *H01L 23/49816* (2013.01); *H01L 23/49827* (2013.01); *H01L 24/73* (2013.01); *H01L 2224/73204* (2013.01)

(58) Field of Classification Search
CPC .......................... H01L 23/3157; H01L 21/563
See application file for complete search history.

(56) References Cited

U.S. PATENT DOCUMENTS

| | | | |
|---|---|---|---|
| 5,065,227 A | * 11/1991 | Frankeny | H05K 3/445 |
| | | | 257/E23.106 |
| 2002/0011657 A1 | * 1/2002 | Saito | H01L 23/13 |
| | | | 257/E23.068 |
| 2006/0103011 A1 | * 5/2006 | Andry | H01L 25/0657 |
| | | | 257/E23.098 |
| 2020/0211946 A1 | 7/2020 | Miki et al. | |
| 2021/0050300 A1 | * 2/2021 | Lin | H01L 23/5383 |
| 2021/0225806 A1 | * 7/2021 | Shen | H01L 23/3157 |
| 2021/0305145 A1 | * 9/2021 | Huang | H01L 21/78 |
| 2022/0020701 A1 | * 1/2022 | Ko | H01L 21/6835 |
| 2022/0051989 A1 | * 2/2022 | Agarwal | H01L 25/0655 |
| 2022/0328445 A1 | * 10/2022 | Yu | H01L 24/96 |

FOREIGN PATENT DOCUMENTS

| | | | | |
|---|---|---|---|---|
| JP | 2014103210 A | * | 6/2014 | |
| JP | 2020077696 A | * | 5/2020 | |
| WO | WO-2010080068 A1 | * | 7/2010 | ........... H01L 21/561 |
| WO | WO-2017216918 A1 | * | 12/2017 | |

* cited by examiner

*Primary Examiner* — Michele Fan
(74) *Attorney, Agent, or Firm* — FOLEY & LARDNER LLP

(57) ABSTRACT

An electronic package is provided. The electronic package includes a first circuit structure, a second circuit structure, and an underfill. The second circuit structure is disposed over the first circuit structure. The underfill is disposed between the first circuit structure and the second circuit structure. An inner portion of the underfill has an inner lateral surface adjacent to and is substantially conformal with a lateral surface of the second circuit structure. A first top end of the inner lateral surface is not level with a top surface of the second circuit structure. An outer portion of the underfill has a second top end higher than the first top end.

14 Claims, 44 Drawing Sheets

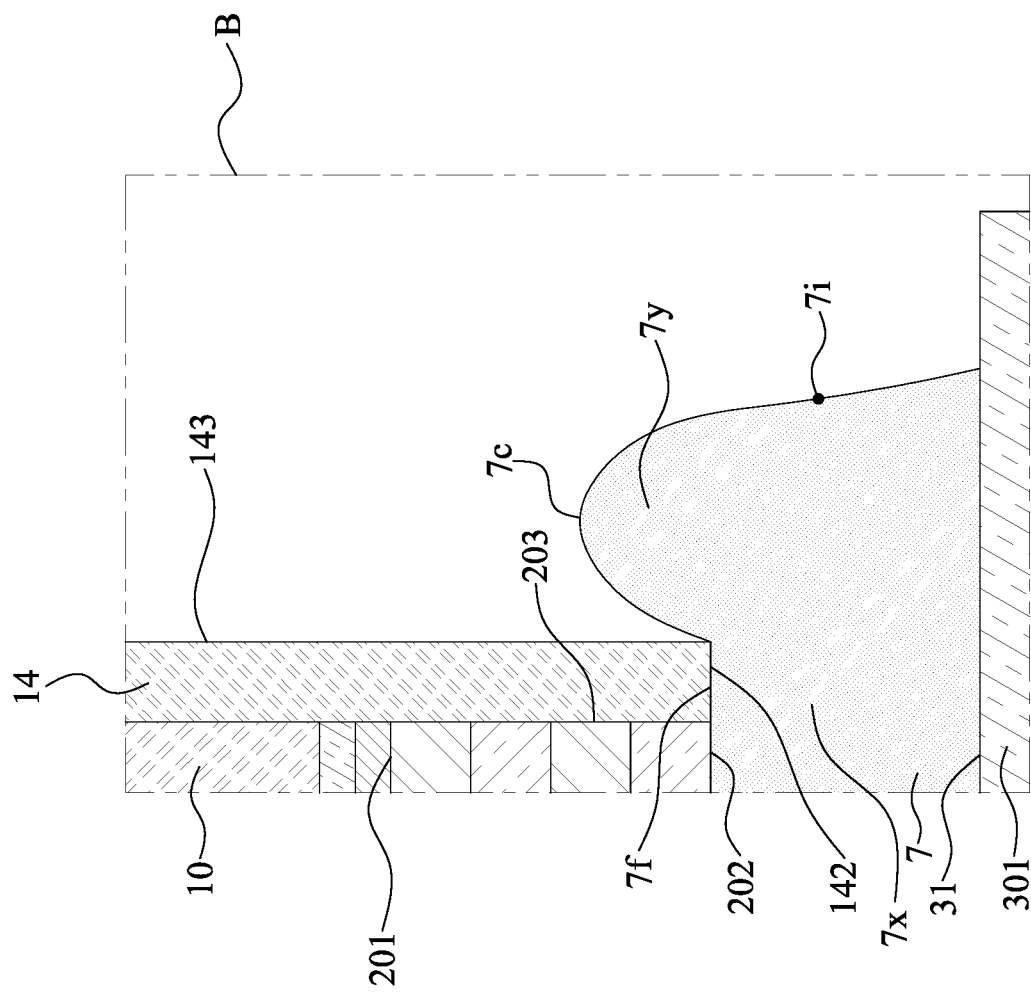

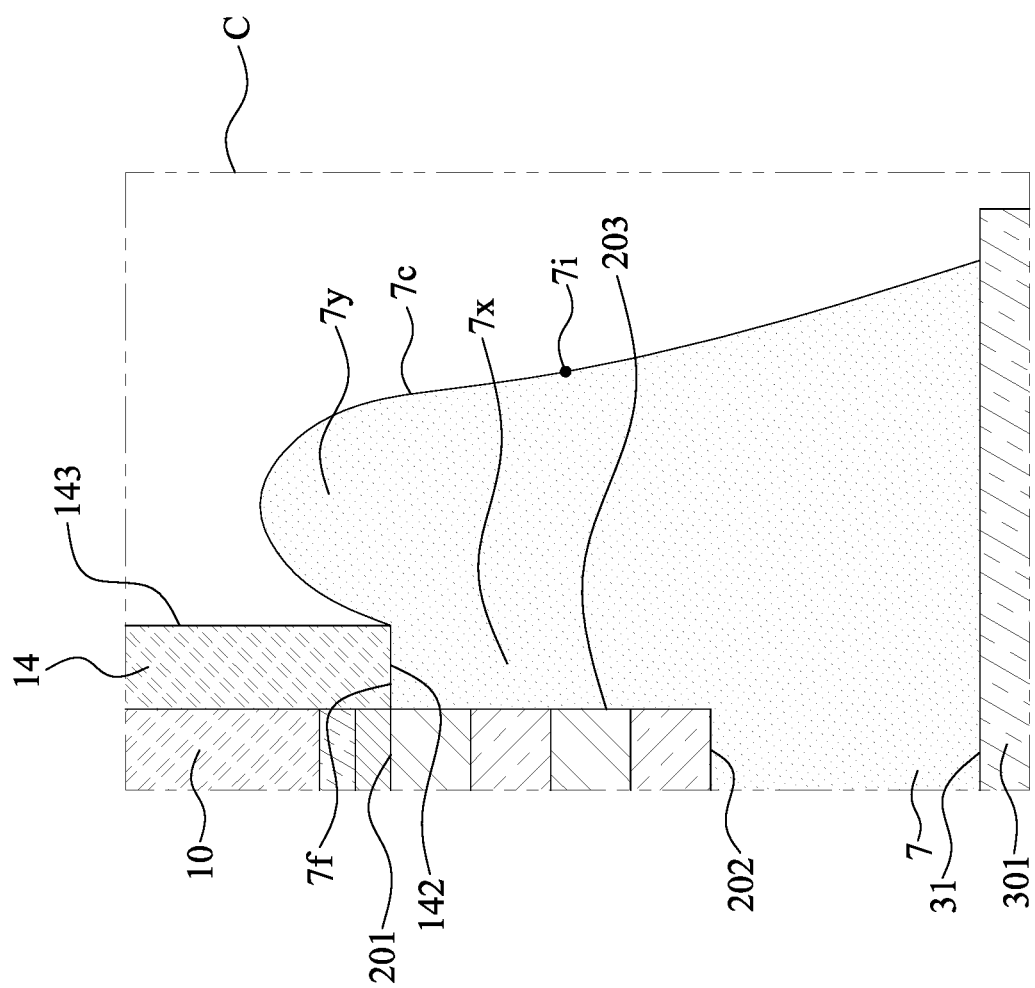

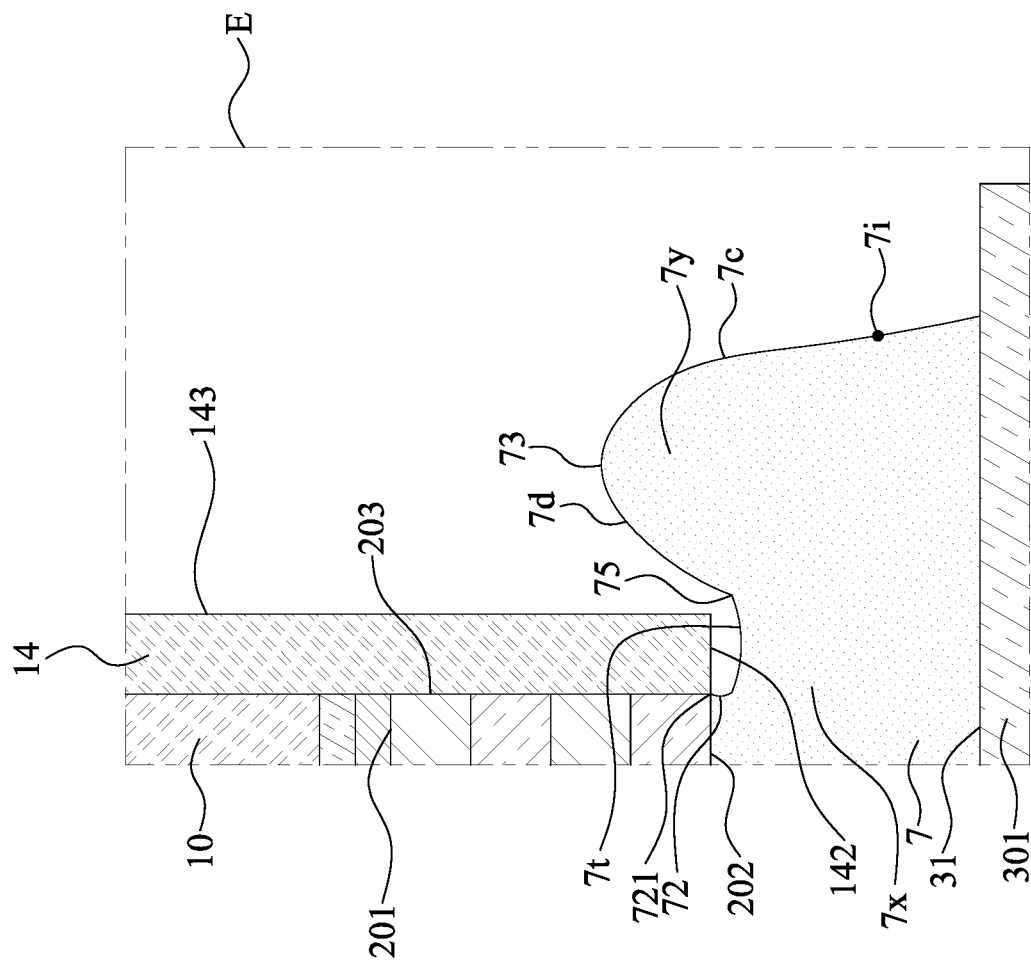

ELECTRONIC PACKAGE

BACKGROUND

1. Field of the Disclosure

The present disclosure relates to an electronic package.

2. Description of the Related Art

With rapid development and progress of semiconductor processing, semiconductor chips are being integrated with an increasing number of electronic components to improve performance and increase functionality. For example, an electronic component with a temporary carrier may be attached to or disposed on other electronic components to form a semiconductor package. To reinforce the robustness thereof, an underfill material may be formed between the electronic components. However, due to the thermal-transformation characteristics of the underfill, it may creep along the sidewall of the temporary carrier, which may lead to de-carrier issues.

SUMMARY

In some embodiments, an electronic package includes a first circuit structure, a second circuit structure, and an underfill. The second circuit structure is disposed over the first circuit structure. The underfill is disposed between the first circuit structure and the second circuit structure. An inner portion of the underfill has an inner lateral surface adjacent to and is substantially conformal with a lateral surface of the second circuit structure. A first top end of the inner lateral surface is not level with a top surface of the second circuit structure. An outer portion of the underfill has a second top end higher than the first top end.

In some embodiments, an electronic package includes a first circuit structure, a second circuit structure, and an underfill. The second circuit structure is disposed over the first circuit structure. The underfill is disposed between the first circuit structure and the second circuit structure. The underfill has a first inner lateral surface adjacent to and is substantially conformal with a lateral surface of the second circuit structure. The underfill has a second inner lateral surface farther from the lateral surface of the second circuit structure than the first inner lateral surface is. The underfill has a step portion between and connected with the first inner lateral surface and the second inner lateral surface.

In some embodiments, an electronic package includes a low-density circuit structure, a high-density circuit structure, and an underfill. The high-density circuit structure is disposed on the low-density circuit structure. The underfill is disposed between the low-density circuit structure and the high-density circuit structure. The underfill has a lateral surface recessed from a lateral surface of the high-density circuit structure

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 19A is a partially enlarged view of a region "B" in FIG. 19A.

FIG. 23A is a partially enlarged view of a region "C" in FIG. 23.

FIG. 35A is a partially enlarged view of a region "E" in FIG. 35.

DETAILED DESCRIPTION

Figure 1:
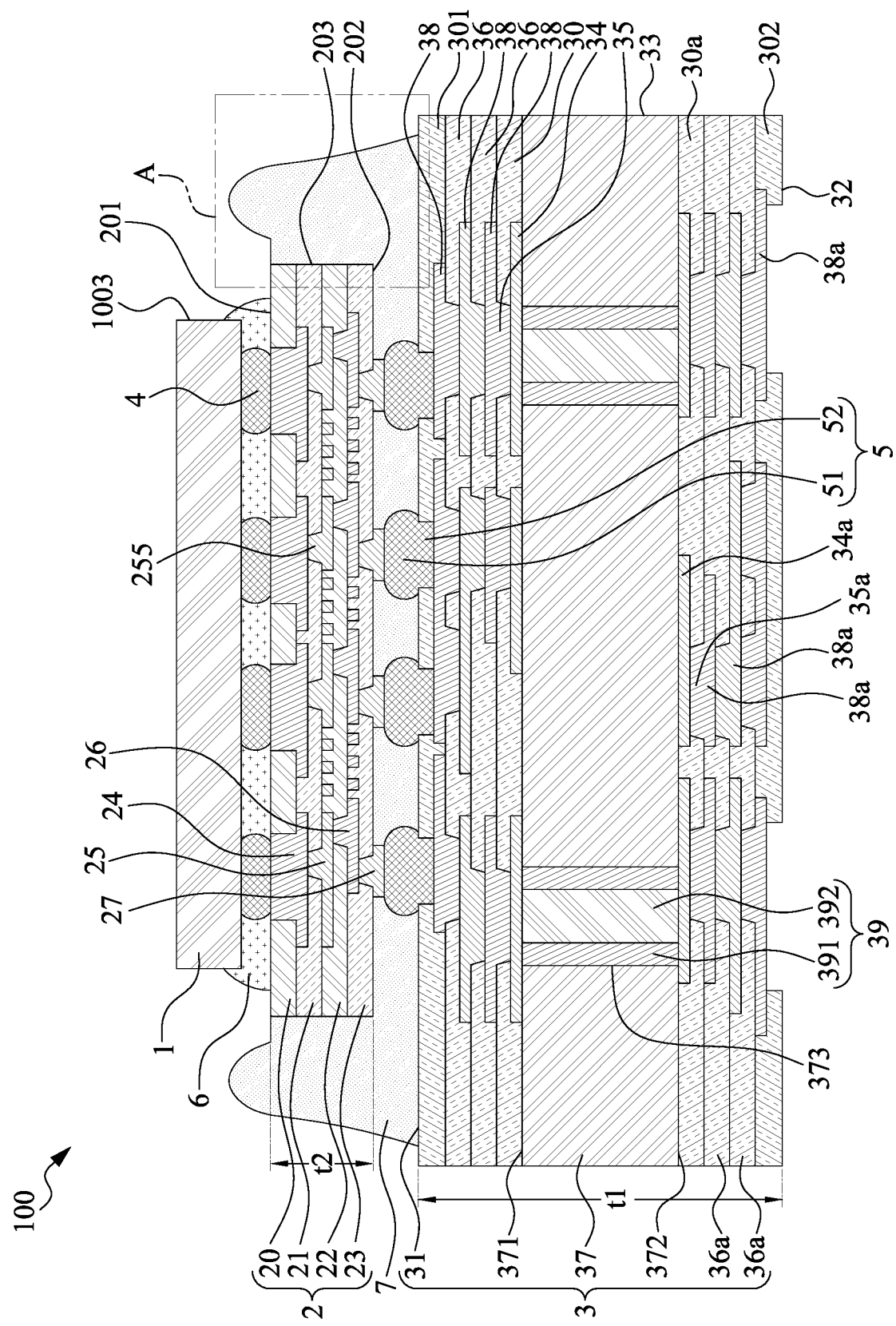
FIG. 1 is a cross-section of an electronic package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-section of an electronic package 100 according to some embodiments of the present disclosure. The electronic package 100 may include an electronic device 1 (or an electronic component), a second circuit structure 2 (e.g., a redistribution layer (RDL) structure), a first circuit structure 3 (e.g., a carrier or a substrate), a plurality of second connecting elements 4, a plurality of first connecting elements 5, a second underfill 6, and a first underfill 7.

The electronic device 1 may include a semiconductor chip. The electronic device 1 may be also referred to as a second electronic component. The electronic device 1 may be disposed on the second circuit structure 2. For example, the electronic device 1 may be electrically connected and bonded to the second circuit structure 2 through the second connecting elements 4 (e.g., solder bumps or other conductive bumps). The plurality of the second connecting elements 4 may be disposed between the electronic device 1 and the second circuit structure 2.

The second underfill 6 may be disposed between the electronic device 1 and the second circuit structure 2. The second underfill 6 may at least cover a portion of a lateral surface 1003 (or an edge) of the electronic device 1. The second underfill 6 may encapsulate the second connecting elements 4. The second underfill 6 may cover a top surface 201 of the second circuit structure 2. The second underfill 6 may contact the top surface 201 of the second circuit structure 2. In some embodiments, the second underfill 6 may include an epoxy resin, a molding compound (e.g., an epoxy molding compound or other molding compound), a polyimide, a phenolic compound or material, a material including a silicone dispersed therein, or a combination thereof.

The second circuit structure 2 may be disposed on or disposed over the first circuit structure 3. The second circuit structure 2 may be also referred to as a first electronic component. The second circuit structure 2 may include at least one dielectric layer (including, for example, a first dielectric layer 20, a second dielectric layer 21, a third dielectric layer 22, and a fourth dielectric layer 24), at least one circuit layer (including, for example, a first circuit layer 24, a second circuit layer 25, a third circuit layer 26, and a fourth circuit layer 27) in contact with the dielectric layer. The circuit layer may be formed of a metal, a metal alloy, or other conductive material. In some embodiments, the second circuit structure 2 may be similar to a coreless substrate, and may be a bumping level redistribution structure. Each of the circuit layers 24, 25, 26, 27 of the second circuit structure 2 may also be referred to as "a high-density circuit layer". The second circuit structure 2 may be referred as a high-density circuit structure. In some embodiments, a density of a circuit line (including, for example, a trace or a pad) of the high-density circuit layer exceeds a density of a circuit line of a low-density circuit layer. That is, the number of circuit lines (including, for example, the trace or the pad) in a unit area of the high-density circuit layer exceeds the number of circuit lines in an equal unit area of the low-density circuit layer, such as 1.2 times or greater, about 1.5 times or greater, or about 2 times or greater, or about 3 times or greater. Alternatively, or in combination, a line width/line space (L/S) of the high-density circuit layer is less than an L/S of the low-density circuit layer, such as about 90% or less, about 50% or less, or about 20% or less.

The second circuit structure 2 has a top surface 201, a bottom surface 202 opposite to the top surface 201, and a lateral surface 203 extending between the top surface 201 and the bottom surface 202. As shown in FIG. 1, the dielectric layers 20, 21, 22, 23 are stacked. For example, the first dielectric layer 20 may be the topmost dielectric layer. For example, the fourth dielectric layer 23 may be the bottommost dielectric layer. In some embodiments, a material of the dielectric layers 20, 21, 22, 23 may be a cured photoimageable dielectric (PID) material such as epoxy or polyimide (PI) including photoinitiators.

The first circuit layer 24 may be a fan-out circuit layer or a redistribution layer (RDL), and an L/S of the circuit layer 24 may be less than about 10 μm/10 μm, less than or equal to 8 μm/8 μm, less than or equal to 5 μm/5 μm, less than or equal to 3 μm/3 μm, less than or equal to about 2 μm/about 2 μm, or less than or equal to about 1.8 μm/about 1.8 μm. In some embodiments, the circuit layer 24 is embedded in the corresponding dielectric layers 20, 21. In some embodiments, the circuit layer 24 may include a seed layer and a conductive material (e.g., a plating metallic material) disposed on the seed layer. As shown in FIG. 1, the topmost circuit layer 24 is covered by the second dielectric layer 21. The topmost circuit layer 24 may contact one of the second connecting elements 4. As such, the electronic device 1 may be electrically connected and bonded to the circuit layer 24 of the second circuit structure 2 through the second connecting elements 4. As illustrated in the embodiment of FIG. 1, a horizontally connecting or extending circuit layer may be omitted from the first dielectric layer 20.

The second circuit layer 25 may be a fan-out circuit layer or a redistribution layer (RDL), and an L/S of the circuit layer 25 may be less than about 10 μm/10 μm, less than or equal to 8 μm/8 μm, less than or equal to 5 μm/5 μm, less than or equal to 3 μm/3 μm, less than or equal to about 2 μm/about 2 μm, or less than or equal to about 1.8 μm/about 1.8 μm. In some embodiments, the circuit layer 25 is embedded in the corresponding dielectric layers 21, 22. In some embodiments, the circuit layer 25 may include a seed layer and a conductive material similar to the seed layer and the conductive material of the circuit layer 24. As shown in FIG. 1, the circuit layer 25 may be covered by the third dielectric layer 22. The circuit layer 25 may include at least one inner via 255 tapering upward.

The third circuit layer 26 may be a fan-out circuit layer or a redistribution layer (RDL), and an L/S of the circuit layer 26 may be less than about 10 μm/10 μm, less than or equal to 8 μm/8 μm, less than or equal to 5 μm/5 μm, less than or equal to 3 μm/3 μm, less than or equal to about 2 μm/about 2 μm, or less than or equal to about 1.8 μm/about 1.8 μm. In some embodiments, the circuit layer 26 is embedded in the corresponding dielectric layers 22, 23. In some embodiments, the circuit layer 26 may include a seed layer and a conductive material similar to the seed layer and the conductive material of the circuit layer 24. As shown in FIG. 1, the circuit layer 26 is covered by the fourth dielectric layer 23.

The fourth circuit layer 27 may be a fan-out circuit layer or a redistribution layer (RDL), and an L/S of the circuit layer 27 may be less than about 10 μm/10 μm, less than or equal to 8 μm/8 μm, less than or equal to 5 μm/5 μm, less than or equal to 3 μm/3 μm, less than or equal to about 2 μm/about 2 μm, or less than or equal to about 1.8 μm/about 1.8 μm. In some embodiments, a portion of the circuit layer 27 may be embedded in the corresponding fourth dielectric layer 23 and another portion of the circuit layer 27 may be exposed from the corresponding fourth dielectric layer 23. In some embodiments, the circuit layer 27 may include a seed layer and a conductive material similar to the seed layer and the conductive material of the circuit layer 24.

The first circuit structure 3 includes at least one dielectric layer (including, for example, one first upper dielectric layer 30, two second upper dielectric layers 36, one first lower dielectric layer 30a, two second lower dielectric layers 36a) and at least one circuit layer (including, for example, one first upper circuit layer 34, three second upper circuit layers 38, one first lower circuit layer 34a and three second lower circuit layers 38a formed of a metal, a metal alloy, or other conductive material) in contact with the dielectric layer (e.g., one first upper dielectric layer 30, two second upper dielectric layers 36, one first lower dielectric layer 30a, two second lower dielectric layers 36a). In some embodiments, the first circuit structure 3 may be similar to a core substrate that further includes a core portion 37. The core portion 37 may include an organic substrate. The circuit layer (including, for example, the first upper circuit layer 34, the second upper circuit layers 38, the first lower circuit layer 34a and the second lower circuit layers 38a) of the first circuit structure 3 may also be referred to as "a low-density circuit layer". The first circuit structure 3 may be referred as a low-density circuit structure. As shown in FIG. 1, the first circuit structure 3 has a top surface 31, a bottom surface 32 opposite to the top surface 31, and a lateral surface 33 extending between the top surface 31 and the bottom surface 32. The first circuit structure 3 may include a plurality of dielectric layers 30, 36, 30a, 36a, a plurality of circuit layers 34, 38, 34a, 38a and at least one inner conductive via (including, for example, a plurality of upper interconnection vias 35 and a plurality of lower interconnection vias 35a). As shown in FIG. 1, the lateral surface 203 of the upper circuit structure 2 may be displaced or recessed from the lateral surface 33 of the first circuit structure 3.

As shown in FIG. 1, the first circuit structure 3 may have a first thickness t1 and the second circuit structure 2 may have a second thickness t2. The second thickness t2 may be less than the first thickness t1.

The core portion 37 has a top surface 371 and a bottom surface 372 opposite to the top surface 371, and defines a plurality of through holes 373 extending through the core portion 37. An interconnection via 39 is disposed or formed in each through hole 373 for vertical connection. In some embodiments, the interconnection via 39 includes a base metallic layer 391 and an insulation material 392. The base metallic layer 391 is disposed or formed on a sidewall of the through hole 373, and defines a central hole. The insulation material 392 fills the central hole defined by the base metallic layer 391. In some embodiments, the interconnection via 39 may omit an insulation material, and may include a bulk metallic material that fills the through hole 373.

The first upper dielectric layer 30 is disposed on the top surface 371 of the core portion 37. The second upper dielectric layers 36 are stacked or disposed on the first upper dielectric layer 30. In addition, the first lower dielectric layer 30a is disposed on the bottom surface 372 of the core portion 37. The second lower dielectric layers 36a are stacked or disposed on the first lower dielectric layer 30a. In some embodiments, the first circuit structure 3 may further include a top protection layer 301 and a bottom protection layer 302. The top protection layer 301 may be a solder resist layer and cover the second upper dielectric layers 36. Further, the top protection layer 301 may define a plurality of openings to expose portions of the second upper circuit layer 38. The bottom protection layer 302 may be a solder resist layer and cover the second lower dielectric layers 36a. Further, the bottom protection layer 302 may define a plurality of openings to expose portions of the second lower circuit layer 38a.

A thickness of each of the dielectric layers 20, 21, 22, 23 of the second circuit structure 2 is less than or equal to about 40%, less than or equal to about 35%, or less than or equal to about 30% of a thickness of each of the dielectric layers 30, 36, 30a, 36a of the first circuit structure 3. In addition, a material of the dielectric layers 30, 36, 30a, 36a of the first circuit structure 3 may be different from the material of the dielectric layers 20, 21, 22, and 23 of the second circuit structure 2. For example, the material of the dielectric layers 30, 36, 30a, 36a of the first circuit structure 3 may be polypropylene (PP) or ajinomoto build-up film (ABF).

An L/S of the first upper circuit layer 34 may exceed or equal about 10 μm/about 10 μm. Thus, the L/S of the first upper circuit layer 34 may exceed or equal about five times the L/S of the circuit layer 24 of the second circuit structure 2. In some embodiments, the first upper circuit layer 34 is formed or disposed on the top surface 371 of the core portion 37, and covered by the first upper dielectric layer 30. In some embodiments, the first upper circuit layer 34 may include a first metallic layer disposed on the top surface 371 of the core portion 37, and may be formed from a copper foil (e.g., may constitute a portion of the copper foil).

An L/S of the second upper circuit layer 38 may exceed or equal about 10 μm/about 10 μm. In some embodiments, the second upper circuit layer 38 is formed or disposed on the first upper dielectric layer 30, and covered by the second upper dielectric layer 36. In some embodiments, the second upper circuit layer 38 is electrically connected to the first upper circuit layer 34 through the upper interconnection vias 35. Each upper interconnection via 35 tapers downwardly along a direction from the top surface 31 towards the bottom surface 32 of the first circuit structure 3. In some embodiments, the second upper circuit layers 38 are electrically connected to each other through the upper interconnection vias 35.

An L/S of the first lower circuit layer 34a may exceed or equal about 10 μm/about 10 μm. In some embodiments, the first lower circuit layer 34a is formed or disposed on the bottom surface 372 of the core portion 37, and covered by the first lower dielectric layer 30a. In some embodiments, the first lower circuit layer 34a may include a first metallic layer disposed on the bottom surface 372 of the core portion 37, and may be copper foil.

An L/S of the second lower circuit layer 38a may exceed or equal about 10 μm/about 10 μm. In some embodiments, the second lower circuit layer 38a is formed or disposed on the first lower dielectric layer 30a, and covered by the second lower dielectric layer 36a. In some embodiments, the second lower circuit layer 38a is electrically connected to the first lower circuit layer 34a through the lower interconnection vias 35a. The lower interconnection via 35a tapers upwardly along a direction from the bottom surface 32 towards the top surface 31 of the first circuit structure 3. In some embodiments, the second lower circuit layers 38a are electrically connected to each other through the lower interconnection vias 35a. The second lower circuit layer 38a may be electrically connected and bonded to a carrier (e.g., a motherboard such as a printed circuit board (PCB)) through connecting elements (e.g., solder bumps or other conductive bumps).

In some embodiments, each interconnection via 39 may electrically connect the first upper circuit layer 34 and the first lower circuit layer 34a.

The plurality of the first connecting elements 5 may be disposed between the first circuit structure 3 and the second circuit structure 2. The fourth circuit layer 27 (e.g., the bottommost circuit layer 27) of the second circuit structure 2 may contact one of the first connecting elements 5. The second upper circuit layer 38 of the first circuit structure 3 may contact one of the connecting elements 5. As such, the first circuit structure 3 (e.g., the second upper circuit layer 38) may be electrically connected and bonded to the second circuit structure 2 (e.g., the bottommost circuit layer 27) through the first connecting elements 5. The first connecting elements 5 may include a portion 51 surrounded by the first underfill 7 and a portion 52 in the openings of the top protection layer 301 of the first circuit structure 3.

The first underfill 7 may be disposed between the second circuit structure 2 and the first circuit structure 3. The first underfill 7 may at least partially encapsulate a portion of the lateral surface 203 (or an edge) of the second circuit structure 2. The first underfill 7 may encapsulate the first connecting elements 5. The first underfill 7 may cover the bottom surface 202 of the second circuit structure 2. The first underfill 7 may contact the bottom surface 202 of the second circuit structure 2. The first underfill 7 may cover the top surface 31 of the first circuit structure 3. The first underfill 7 may contact the top surface 31 of the first circuit structure 3. In some embodiments, the first underfill 7 may include an epoxy resin, a molding compound (e.g., an epoxy molding compound or other molding compound), a polyimide, a phenolic compound or material, a material including silicone dispersed therein, or a combination thereof. A material of the second underfill 6 may be different from that of the first underfill 7. The comprehensive profile of the first underfill 7 in a region "A" adjacent to the edge of the second circuit structure 2 is detailed in FIG. 2.

Figure 2:
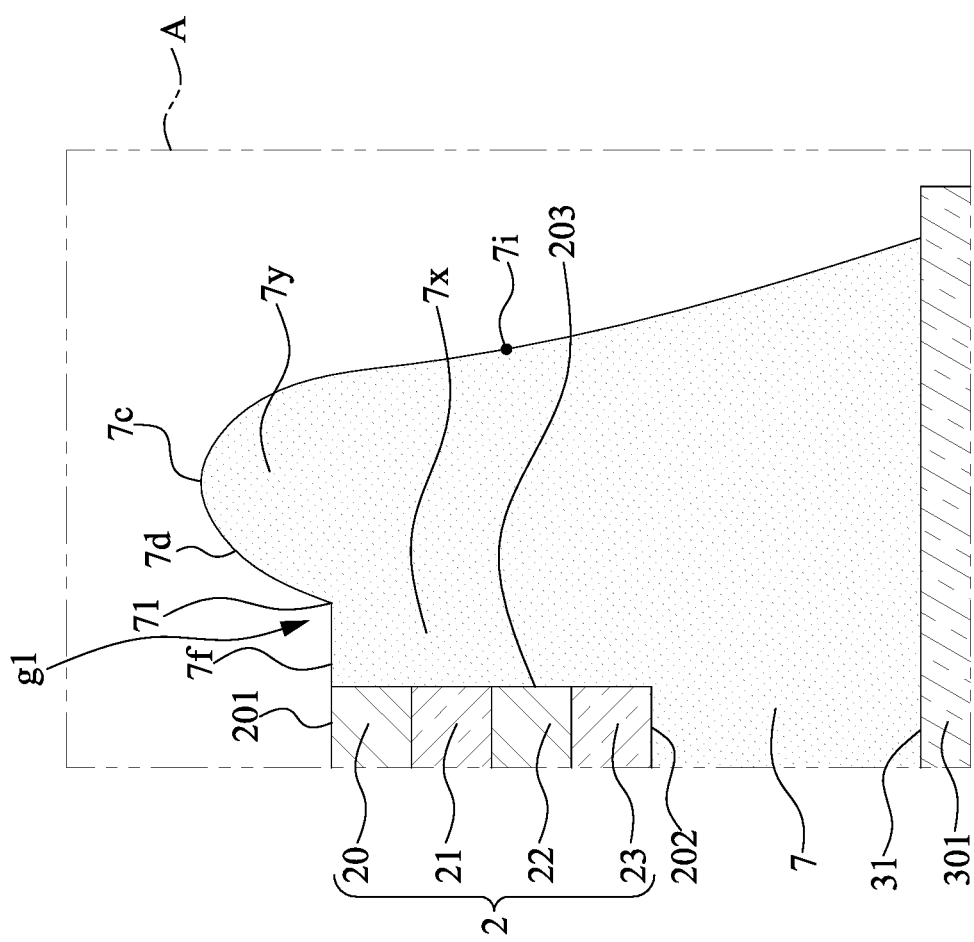
FIG. 2 is a partially enlarged view of a region "A" in FIG. 1.

FIG. 2 is a partially enlarged view of the region "A" in FIG. 1. As shown in FIG. 2, the first underfill 7 may include a first portion (or an inner portion) 7x contacting the lateral surface 203 (or the edge) of the second circuit structure 2 and a second portion (or an outer portion) 7y connecting the first portion 7x. The first portion 7x of the first underfill 7 may have a substantially flat surface 7f which may be a top surface of the first portion 7x. The second portion 7y may be disposed outside of the lateral surface 203 of the second circuit structure 2. The second portion 7y of the first underfill 7 may have a curved surface 7c. The substantially flat surface 7f and the curved surface 7c may be connected. The substantially flat surface 7f may be located between the top surface 201 of the second circuit structure 2 and the curved surface 7c. The substantially flat surface 7f of the first portion 7x of the first underfill 7 may be substantially level with or higher than the top surface 201 of the second circuit structure 2. Alternatively, the substantially flat surface 7f of the first portion 7x of the first underfill 7 may be substantially level with or higher than the bottom surface 202 of the second circuit structure 2. The curved surface 7c may be higher than the substantially flat surface 7f. The curved surface 7c of the second portion 7y of the first underfill 7 may be a continuous curved surface. The continuous curved surface 7c may extend from an end of the substantially flat surface 7f to the top surface 31 of the first circuit structure 3. The curved surface 7c and the substantially flat surface 7f may intersect at an intersection point 7l (or an edge). The edge 71 and the second circuit structure 2 may define a first gap g1 therebetween. The continuous curved surface 7c may include an inflection point 7i. The inflection point 7i may be lower than the top surface 201 of the second circuit structure 2. A curvature of a portion of the curved surface 7c higher than the inflection point 7i is discontinuous or different with a curvature of the other portion of the curved surface 7c lower than the inflection point 7i. In addition, an inner lateral surface 7d of the second portion 7y extending from the intersection point 7l (or the intersection edge) to a top end of the continuous curved surface 7c is a free curved surface.

Figure 3:
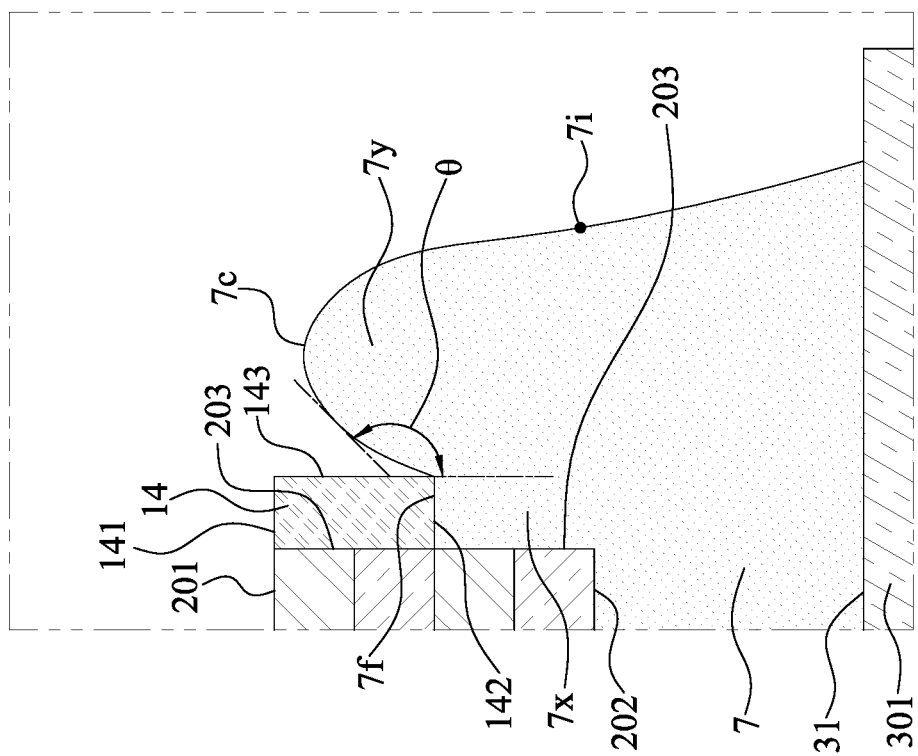
FIG. 3 is another partially enlarged view of an electronic package according to some embodiments of the present disclosure.

FIG. 3 is a partially enlarged view of an electronic package according to some embodiments of the present disclosure. The structure of FIG. 3 is similar to that of FIG. 2, except that a repelling layer 14 may be disposed on the substantially flat surface 7f. The repelling layer 14 may contact the substantially flat surface 7f. The repelling layer 14 may at least cover a portion of the lateral surface 203 of the second circuit structure 2. As shown in FIG. 3, a contact angle θ of the second portion 7y of the first underfill 7 on the repelling layer 14 may be greater than 90 degrees. The substantially flat surface 7f may be closer to the upper surface 201 of the RDL structure 2 than the bottom surface 202 of the RDL structure 2 is.

In some embodiments, the repelling layer 14 may be configured to modify a surface tension of the first underfill 7 with respect to the repelling layer 14. The repelling layer 14 may be configured to harden the first underfill 7. The material of the repelling layer 14 may include, for example but is not limited to, a release agent, such as Polytetrafluoroethylene (PTFE), fluorocarbon-based polymer, wax, etc. The material of the repelling layer 14 may include, for example but is not limited to, a reagent which may be configured to alter the characteristic of the first underfill 7. For example, the reagent of the repelling layer 14 may be configured to harden the first underfill 7 or modify a surface tension of the first underfill 7. As a result, the profile of the first underfill 7 may be modified during the manufacture of the electronic package 100. For example, the first underfill 7 may have a curved surface (e.g., the curved surface 7c) changing from concave to convex or vice versa. In other words, the curved surface 7c may have an inflection point 7i. In addition, the repelling layer 14 may further have a top surface 141 opposite to the bottom surface 142 and a lateral surface 143 extending between the top surface 141 and the bottom surface 142. The top surface 141 of the repelling layer 14 may be substantial coplanar with the top surface 201 of the second circuit structure 2. The first underfill 7 may not creep on or contact the lateral surface 143 of the repelling layer 14.

Figure 4:
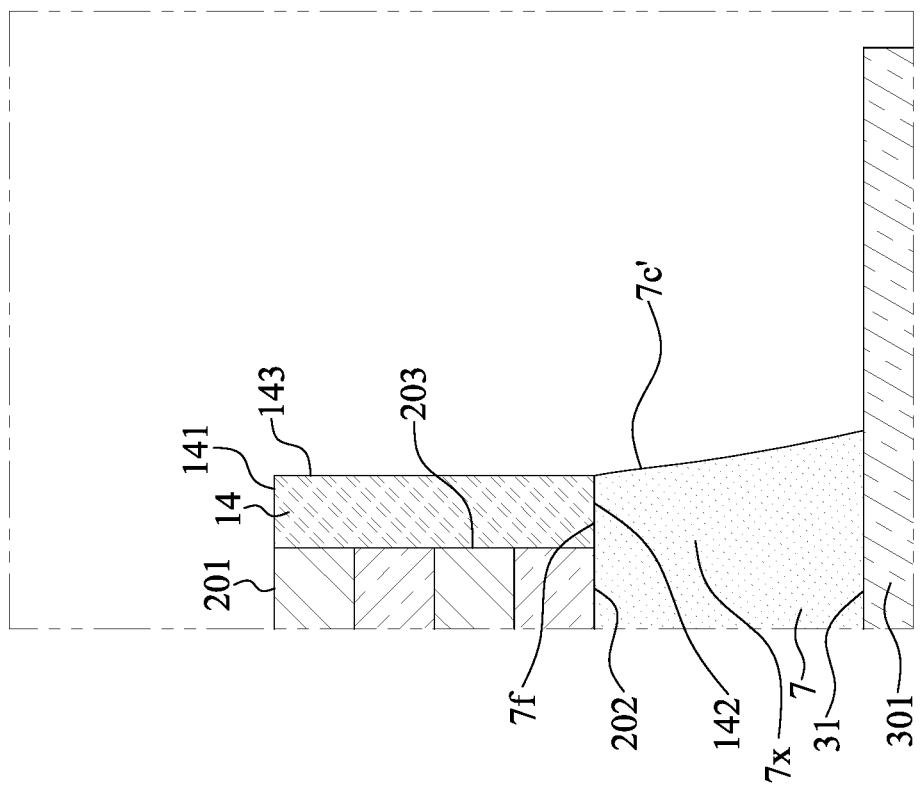
FIG. 4 is another partially enlarged view of an electronic package according to some embodiments of the present disclosure.

FIG. 4 is a partially enlarged view of an electronic package according to some embodiments of the present disclosure. The structure of FIG. 4 is similar to that of FIG. 3, except that the first underfill 7 only have the first portion 7x. In other words, the first underfill 7 of FIG. 4 may not have a second portion 7y. The first portion 7x has a curved lateral surface 7c', which may be concave or convex.

Figure 5:
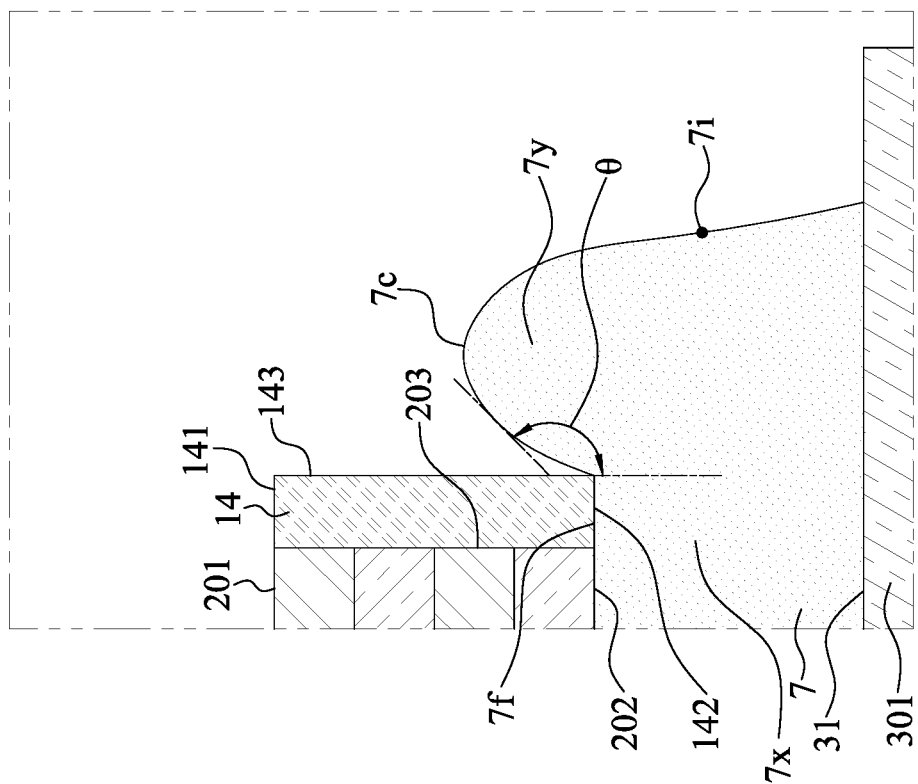
FIG. 5 is another partially enlarged view of an electronic package according to some embodiments of the present disclosure.

FIG. 5 is a partially enlarged view of an electronic package according to some embodiments of the present disclosure. The structure of FIG. 5 is similar to that of FIG. 3, except that the substantially flat surface 7f of the second circuit structure 2 may be substantially level with the bottom surface 202 of the second circuit structure 2. In other words, the substantially flat surface 7f and the bottom surface 202 of the second circuit structure 2 may be substantially coplanar.

Figure 6:
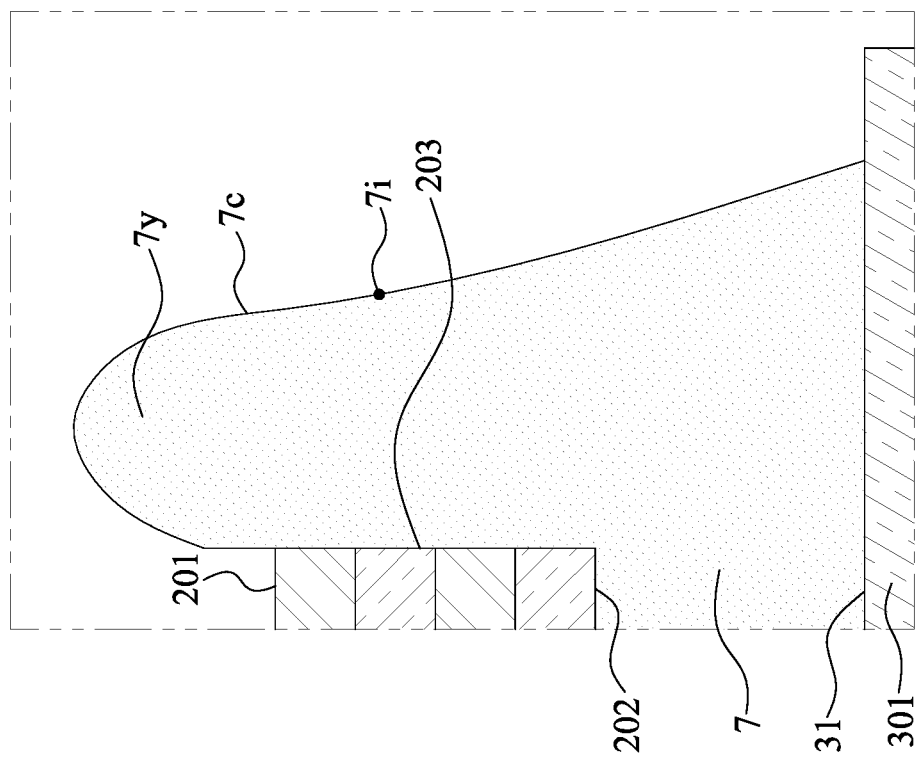
FIG. 6 is another partially enlarged view of an electronic package according to some embodiments of the present disclosure.

FIG. 6 is a partially enlarged view of an electronic package according to some embodiments of the present disclosure. The structure of FIG. 6 is similar to that of FIG. 2, except that the curved surface 7c may connect to the top surface 201 of the second circuit structure 2. In other words, the substantially flat surface 7f may be omitted.

Figure 7:
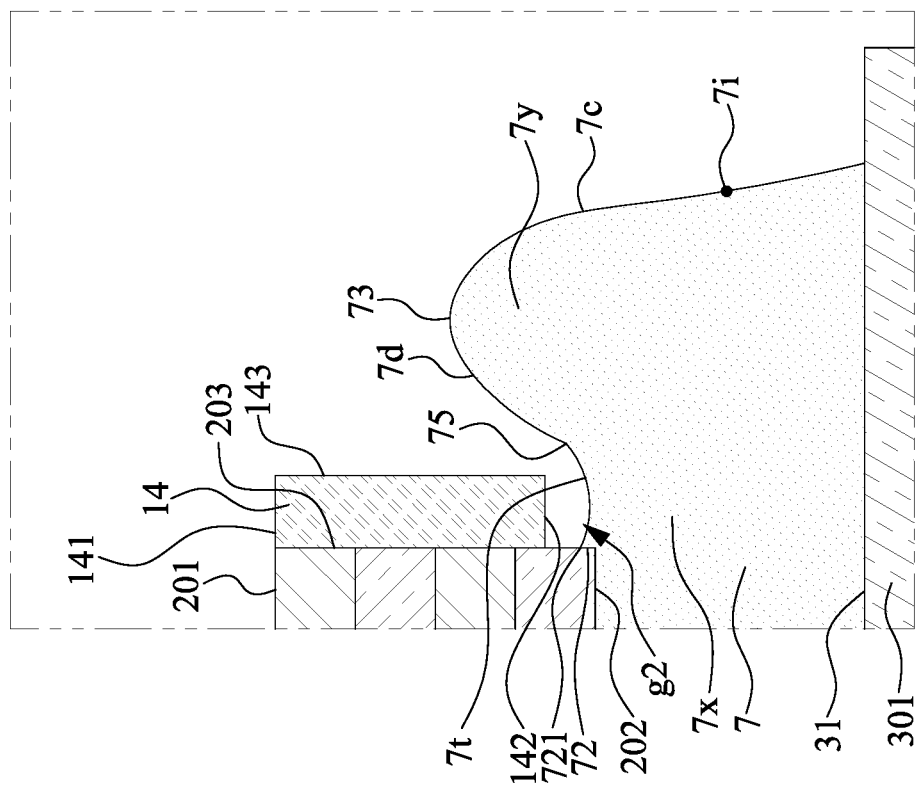
FIG. 7 is another partially enlarged view of an electronic package according to some embodiments of the present disclosure.

FIG. 7 is a partially enlarged view of an electronic package according to some embodiments of the present disclosure. The structure of FIG. 7 is similar to that of FIG. 5, and the difference therebetween would be discussed below.

As shown in FIG. 7, the first portion 7x (e.g., the inner portion) of the first underfill 7 may have a first inner lateral surface 72 and a step portion 7t. The first inner lateral surface 72 may be adjacent to and substantially conformal with the lateral surface 203 of the second circuit structure 2. In some embodiments, the first inner lateral surface 72 of the first portion 7x (e.g., the inner portion) of the first underfill 7 may contact the lateral surface 203 of the second circuit structure 2. A first top end (or a first edge) 721 of the first inner lateral surface 72 may not level with the top surface 201 or the bottom surface 202 of the second circuit structure 2. The second portion 7y (e.g., the outer portion) of the first underfill 7 may have a second top end 73 higher than the first top end 721. The first top end 721 may be located at a level between the top surface 201 of the second circuit structure 2 and the bottom surface 202 of the second circuit structure 2. The repelling layer 14 may be disposed above the first top end 721 of the first inner lateral surface 72 and the step portion 7t. Because of the material characteristic of the repelling layer 14 as stated above, the repelling layer 14 may be free from contacting the first underfill 7. The repelling layer 14 may be spaced apart from or distant from the first portion 7x (e.g., the inner portion) and the second portion 7y (e.g., the outer portion) of the first underfill 7. That is, the repelling layer 14 may repel the first underfill 7. For example, the repelling layer 14 may be free from contacting the step portion 7t of the inner portion 7x. The repelling layer 14 may be spaced apart from the step portion 7t of the inner portion 7x. The repelling layer 14 may be distant from the step portion 7t. In addition, the first top end 721 may be higher than the bottom surface 201 of the second circuit structure 2. The bottom surface 142 of the repelling layer 14 and the inner portion 7x of the first underfill 7 may define a second gap g2 therebetween.

The outer portion 7y has a curved surface 7c. The curved surface 7c of the outer portion 7y and a top surface of the inner portion 7x (or the step portion 7t of the inner portion 7x) may intersect at an inflection edge (or an intersection edge) 75. A curvature of the top surface of the inner portion 7x (or the step portion 7t of the inner portion 7x) is discontinuous with or different from a curvature of the curved surface 7c of the outer portion 7y. That is, the inflection edge 75 is an edge that is constituted with a plurality of inflection points or turning points. The first top end 721 may be distant from the inflection edge 75. The first top end 721 may be not level with the inflection edge (or an intersection edge) 75. The curved surface 7c of the outer portion 7y may have at least one inflection point 7i or an inflection edge.

As shown in FIG. 7, the curved surface 7c of the outer portion 7y of the first underfill 7 may have a second inner lateral surface 7d. The second inner lateral surface 7d of the outer portion 7y may be farther from the lateral surface 203 of the second circuit structure 2 than the first inner lateral surface 72 is. The step portion 7t may be between and connected with the first inner lateral surface 72 and the second inner lateral surface 7d. The step portion 7t may be located at a level between the top surface 201 of the second circuit structure 2 and the bottom surface 202 of the second circuit structure 2. The step portion 7t may be higher than the bottom surface 202 of the second circuit structure 2. The step portion 7t may include a recess portion. That is, a top surface of the step portion 7t may be a concave surface. Two opposite ends of the step portion 7t may be the first edge 721 (i.e., the first top end 721 of the first inner lateral surface 72) and the inflection edge (or the intersection edge) 75, respectively. The two opposite edges 721, 75 of the step portion 7t may be not at a same level. The inflection edge (or the intersection edge) 75 may be higher than the first edge 721 (i.e., the first top end 721 of the first inner lateral surface 72).

Figure 8:
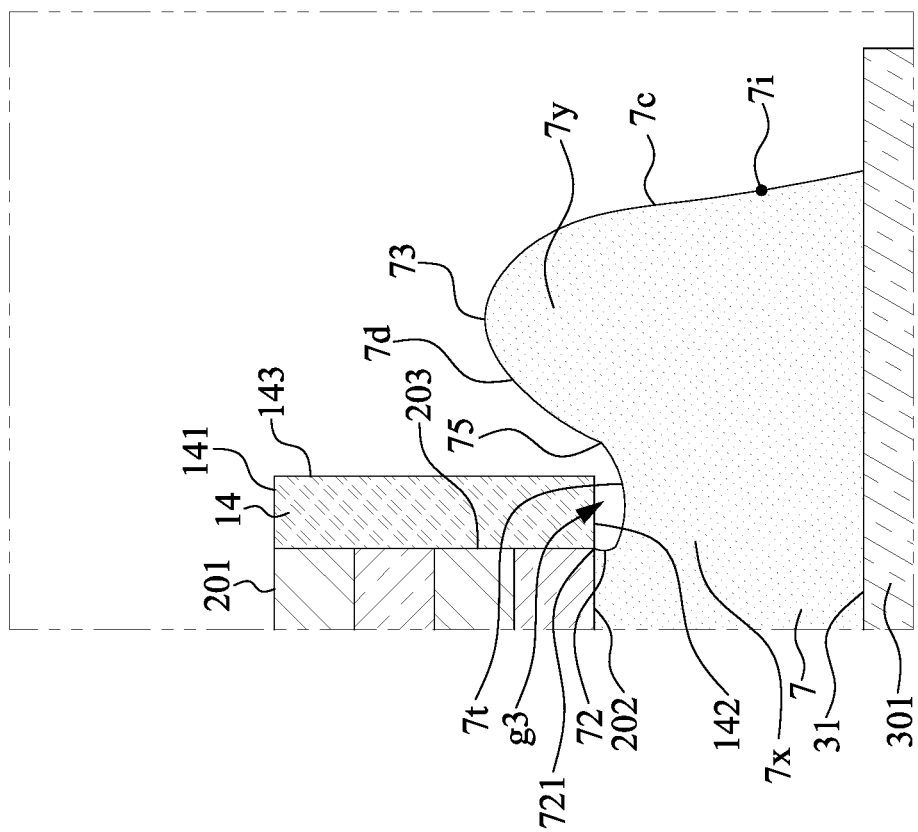
FIG. 8 is another partially enlarged view of an electronic package according to some embodiments of the present disclosure.

FIG. 8 is a partially enlarged view of an electronic package according to some embodiments of the present disclosure. The structure of FIG. 8 is similar to that of FIG. 7, and the difference therebetween would be discussed below.

As shown in FIG. 8, the bottom surface 142 of the repelling layer 14 and the bottom surface 202 of the second circuit structure 2 may be substantially coplanar. The bottom surface 142 of the repelling layer 14 and the inner portion 7x of the first underfill 7 may define a third gap g3 therebetween. The third gap g3 may be lower than the bottom surface 202 of the second circuit structure 2. The step portion 7t of the inner portion 7x of the first underfill 7 may be lower than the bottom surface 202 of the second circuit structure 2. The first lateral surface 72 of the inner portion 7x of the first underfill 7 may be lower than the lateral surface 203 of the second circuit structure 2. The first top end 721 of the first lateral surface 72 may be at the corner of the repelling layer 14 or at the corner of the second circuit structure 2.

Figure 9:
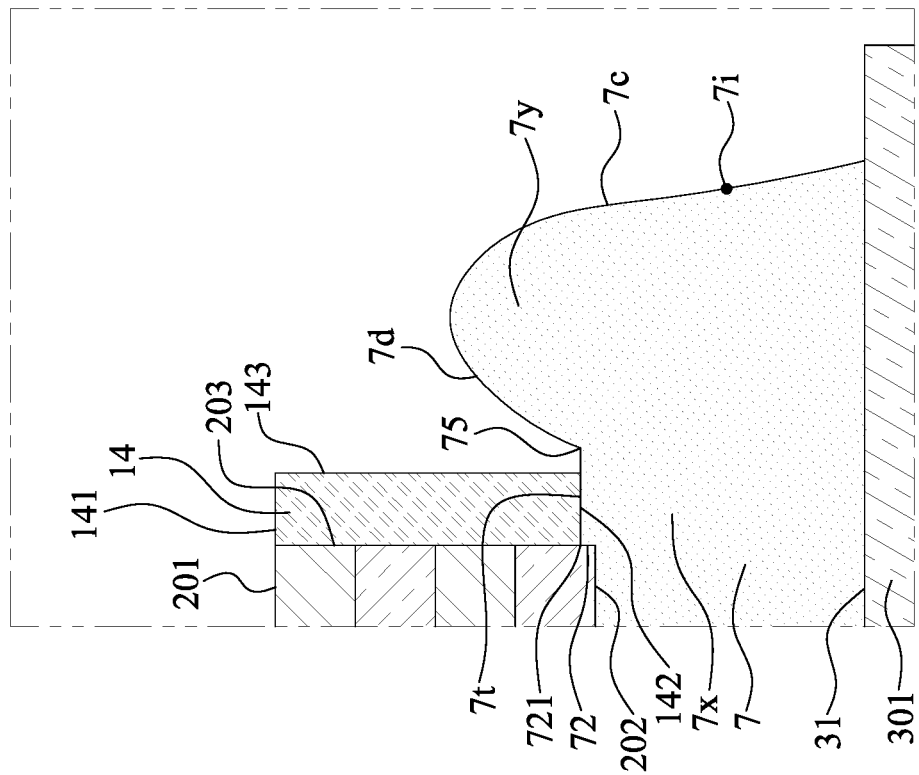
FIG. 9 is another partially enlarged view of an electronic package according to some embodiments of the present disclosure.

FIG. 9 is a partially enlarged view of an electronic package according to some embodiments of the present disclosure. The structure of FIG. 9 is similar to that of FIG. 7, and the difference therebetween would be discussed below.

As shown in FIG. 9, the step portion 7t of the inner portion 7x of the first underfill 7 may contact the bottom surface 142 of the repelling layer 14. Thus, the step portion 7t may have a surface conformal with the bottom surface 142 of the repelling layer 14. For example, the step portion 7t may have a flat surface. Furthermore, the step portion 7t may be longer than the bottom surface 142 of the repelling layer 14.

Figure 10:
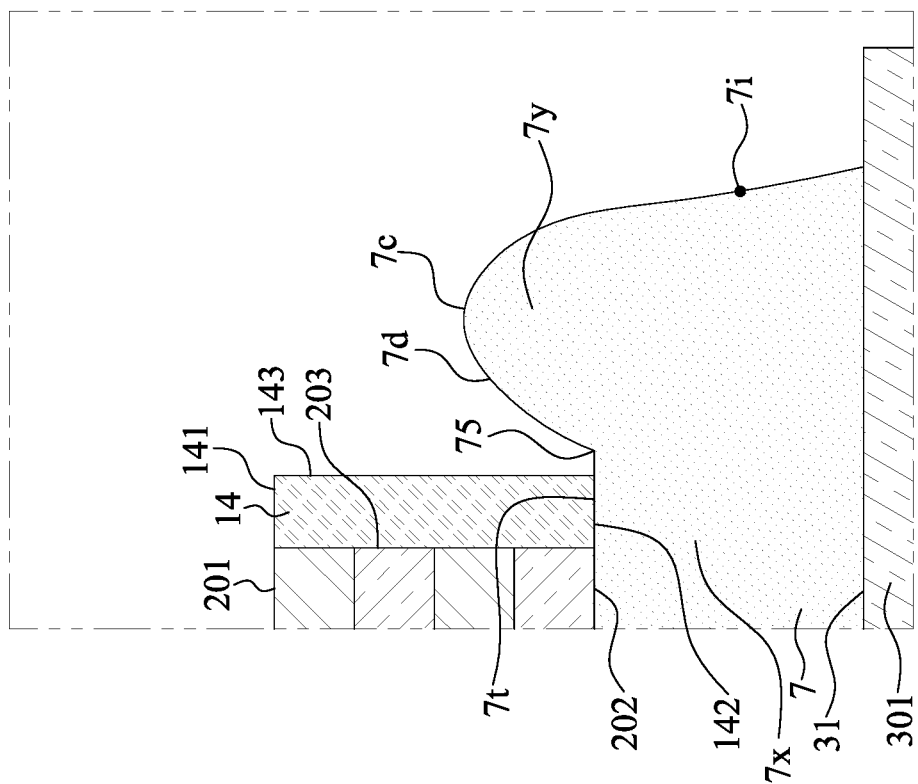
FIG. 10 is another partially enlarged view of an electronic package according to some embodiments of the present disclosure.

FIG. 10 is a partially enlarged view of an electronic package according to some embodiments of the present disclosure. The structure of FIG. 10 is similar to that of FIG. 9, and the difference therebetween would be discussed below.

As shown in FIG. 10, the bottom surface 142 of the repelling layer 14 and the bottom surface 202 of the second circuit structure 2 may be coplanar. As such, the step portion 7t of the inner portion 7x of the first underfill 7 may be level with the bottom surface 202 of the second circuit structure 2.

Figure 11:
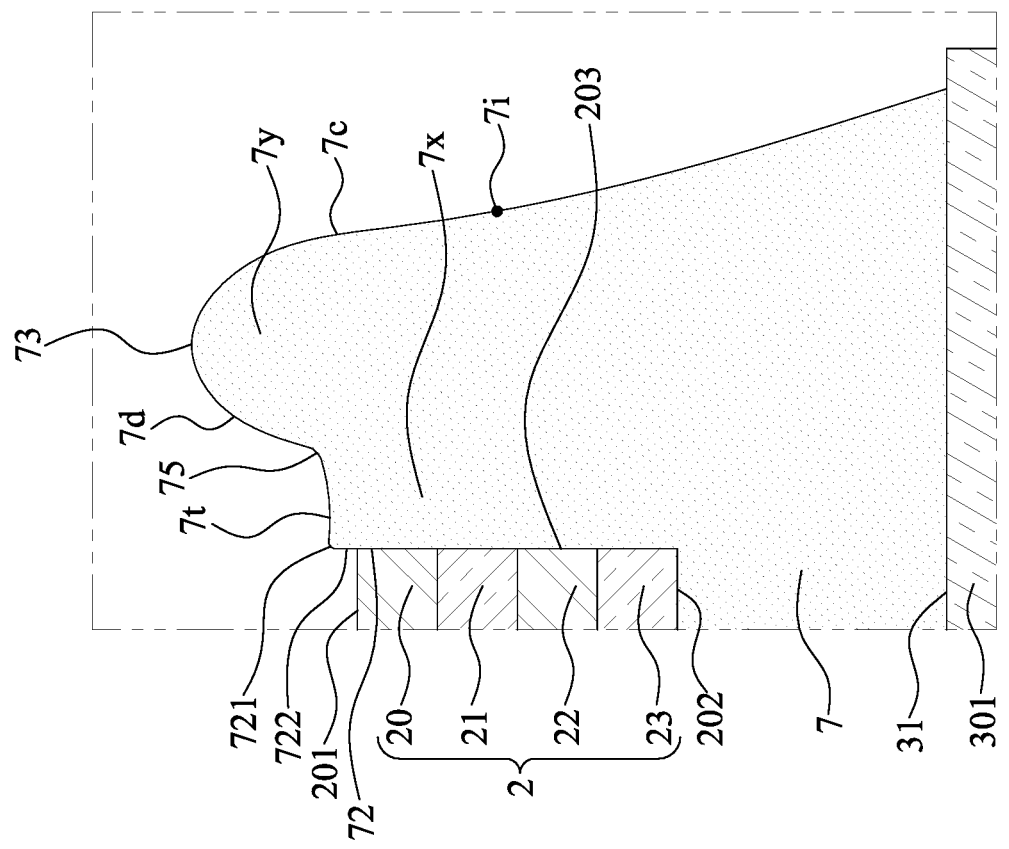
FIG. 11 is another partially enlarged view of an electronic package according to some embodiments of the present disclosure.

FIG. 11 is a partially enlarged view of an electronic package according to some embodiments of the present disclosure. The structure of FIG. 11 is similar to that of FIG. 7, and the difference therebetween would be discussed below.

As shown in FIG. 11, a portion 722 of the inner lateral surface 72 may extend beyond the top surface 201 of the second circuit structure 2. Thus, the first top end 721 and the step portion 7t may be higher than the top surface 201 of the second circuit structure 2. The portion 722 of the inner lateral surface 72 may be substantially aligned with the lateral surface 203 of the second circuit structure 2. A first top end 721 of the inner lateral surface 72 may be not level with the top surface 201 of the second circuit structure 2. The second portion 7y (e.g., the outer portion) of the first underfill 7 may have a second top end 73 higher than the first top end 721. The first top end 721 may be located above the top surface 201 of the second circuit structure 2.

Figure 12:
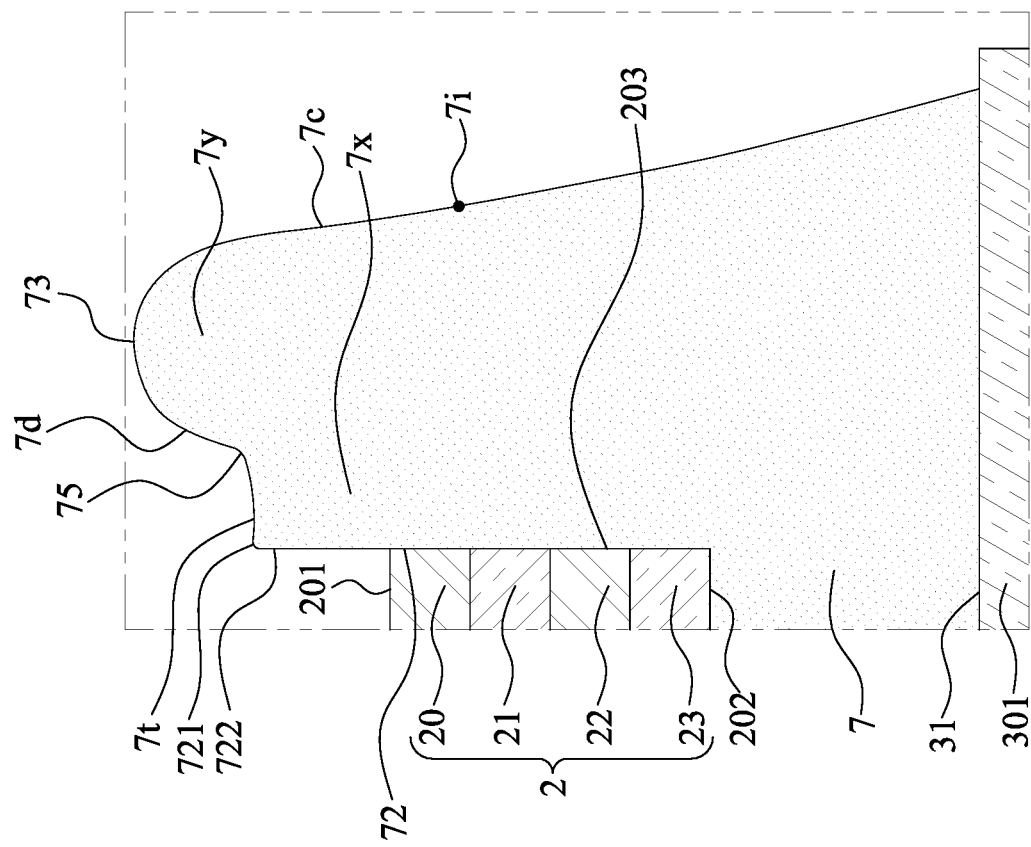
FIG. 12 is another partially enlarged view of an electronic package according to some embodiments of the present disclosure.

FIG. 12 is a partially enlarged view of an electronic package according to some embodiments of the present disclosure. The structure of FIG. 12 is similar to that of FIG. 11, except that the portion 722 of the inner lateral surface 72 may have a height greater than that of FIG. 11.

Figure 13:
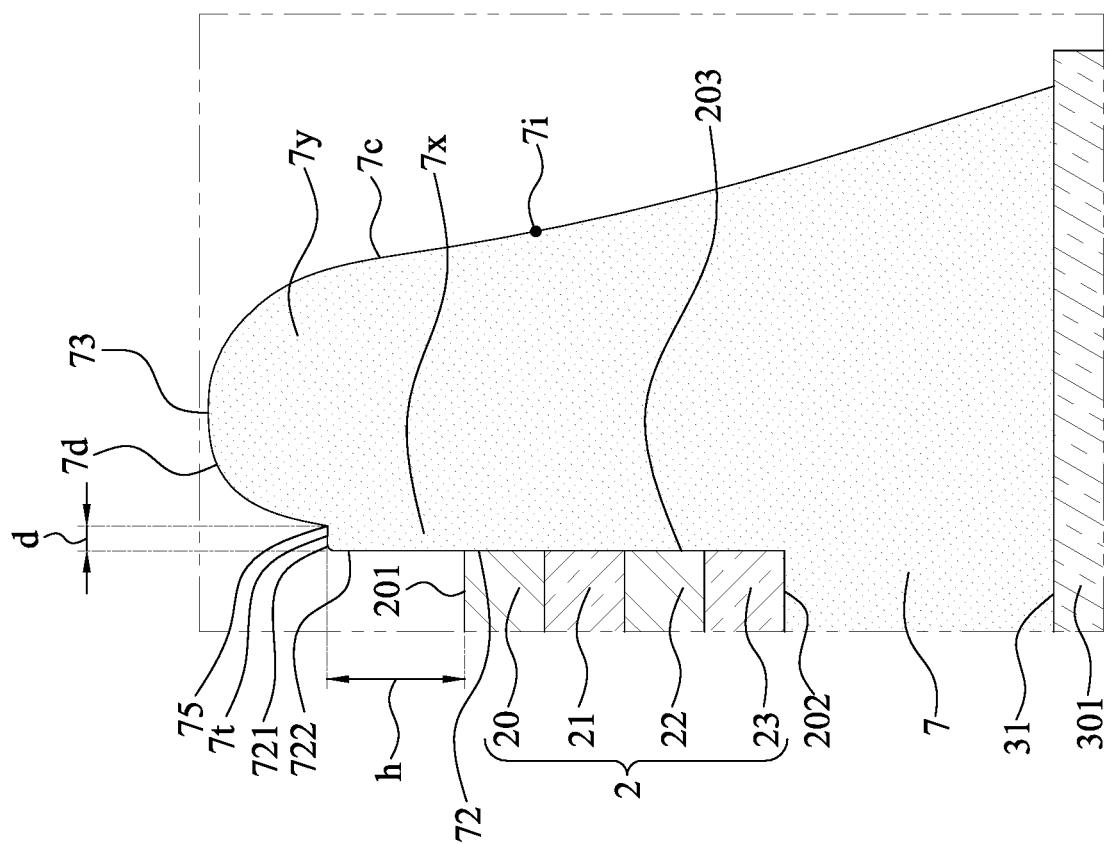
FIG. 13 is another partially enlarged view of an electronic package according to some embodiments of the present disclosure.

FIG. 13 is a partially enlarged view of an electronic package according to some embodiments of the present disclosure. The structure of FIG. 13 is similar to that of FIG. 11, and the difference therebetween would be discussed below.

As shown in FIG. 13, a height h of the portion 722 of the inner lateral surface 72 may be greater than that of FIG. 11. The height h of the portion 722 extending beyond the second circuit structure 2 may be greater than a distance d between the first top end 721 and the second inner surface 7d of the outer portion 7y. It is noted that the distance d may be equal to a width of the step portion 7t of the inner portion 7x of the first underfill 7. The portion 722 of the inner lateral surface 72 may be substantially aligned with the lateral surface 203 of the second circuit structure 2. The step portion 7t of the inner portion 7x of the first underfill 7 may be higher than the top surface 201 of the second circuit structure 2.

Figure 13A:
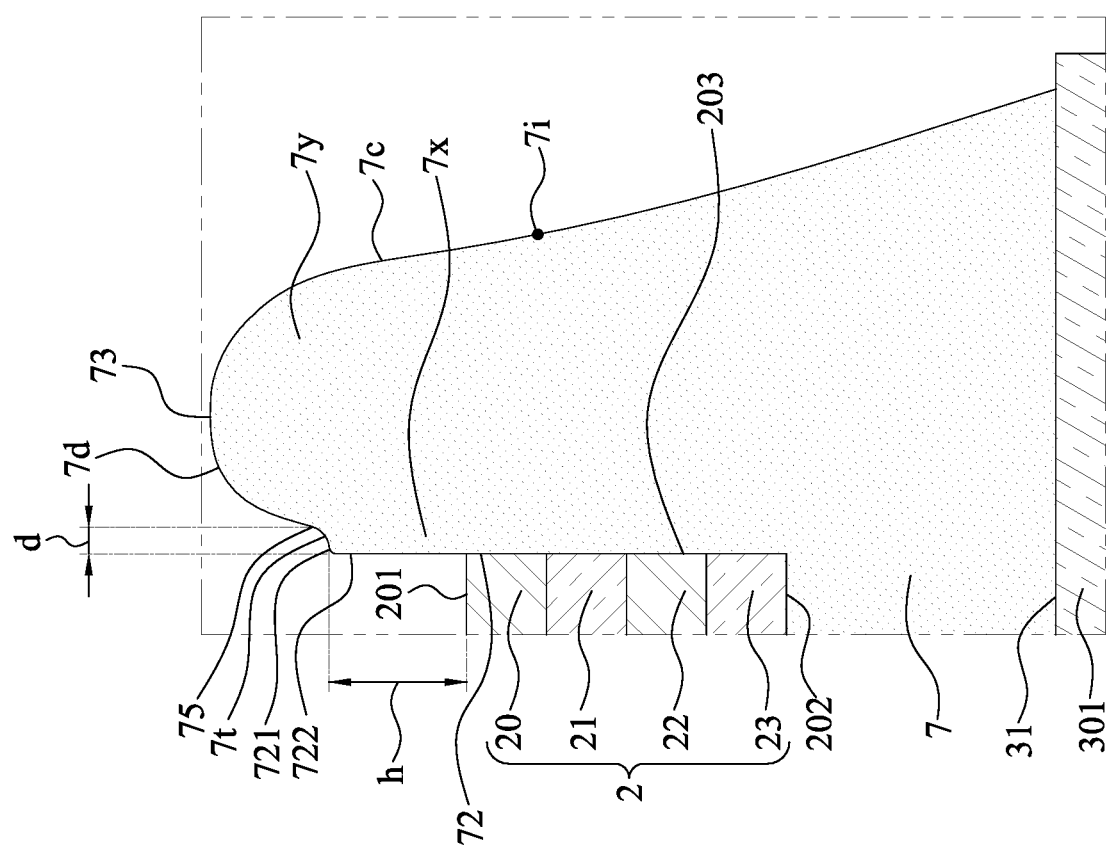
FIG. 13A is a partially enlarged view of an electronic package according to some embodiments of the present disclosure.

FIG. 13A is a partially enlarged view of an electronic package according to some embodiments of the present disclosure. The structure of FIG. 13A is similar to that of FIG. 13, and the difference therebetween would be discussed below. The step portion 7t of FIG. 13 may have a substantially slant shape. Two opposite ends of the step portion 7t may not be at a same level. The distance d between the top end 721 of the portion 722 of the inner lateral surface 72 and the inflection edge 75 may be relatively small, such that there may be no substantially flat surface therebetween.

FIGS. 14 through 21 illustrate a method for manufacturing an electronic package according to some embodiments of the present disclosure. In some embodiments, the method is for manufacturing the electronic package 100 shown in FIG. 1, FIG. 3, FIG. 4, and FIG. 5.

Figure 14:
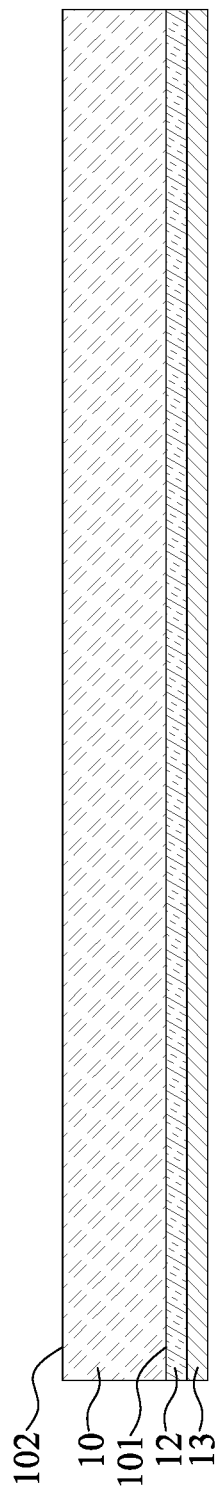
FIG. 14 shows one or more stages of an exemplary method for manufacturing an electronic package according to some embodiments of the present disclosure.

Referring to FIG. 14, a carrier 10 (e.g., a temporary carrier) may be provided. A release layer 12 may be formed on the carrier 10. The carrier 10 may have a first surface 101, a second surface 102. The release layer 12 may be configured to adhere the first surface 101 of the carrier 10 with other materials or layers. The release layer 12 may be configure to de-bond the carrier 10 in a release process. Furthermore, a seed layer 13 may be formed on the release layer 12, for example, by sputtering.

Figure 15:
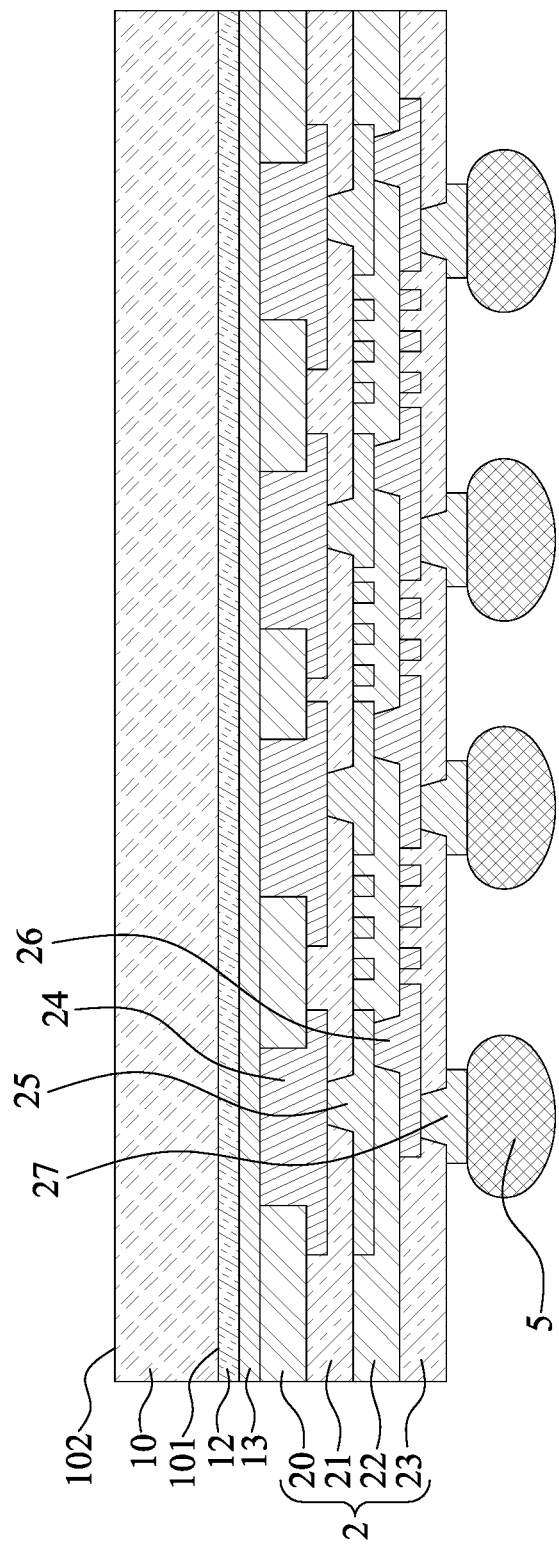
FIG. 15 shows one or more stages of an exemplary method for manufacturing an electronic package according to some embodiments of the present disclosure.

Referring to FIG. 15, a second circuit structure 2 may be formed and attached to the carrier 10 with the release layer 12. The process of forming the second circuit structure 2 may include patterning the seed layer 13, and a circuit layer 24 of the second circuit structure 2 may be subsequently formed on the patterned seed layer 13. The second circuit structure 2 may include the patterned seed layer 13. The processing of forming the second circuit structure 2 may further include forming dielectric layers 20, 21, 22, and 23 and forming circuit layers 24, 25, 26, and 27.

Again referring to FIG. 15, a plurality of first connecting elements 5 may be formed on the circuit layer 27 by, for example, bumping. The first connecting elements 5 may be configured to electrically connect the second circuit structure 2 with other electronic components.

Figure 16:
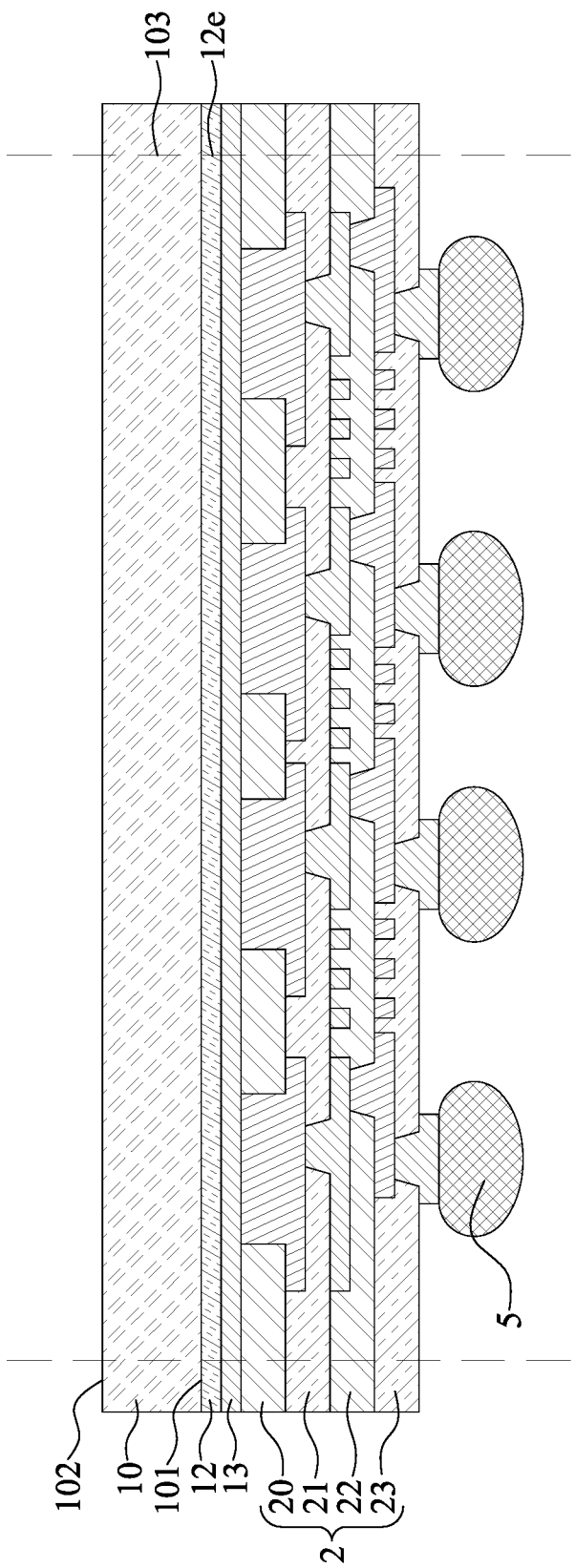
FIG. 16 shows one or more stages of an exemplary method for manufacturing an electronic package according to some embodiments of the present disclosure.

Referring to FIG. 16, the second circuit structure 2 along with the carrier 10 may be singulated to obtain the second circuit structure 2 of FIG. 1. After the singulation, the carrier 10 may have a lateral surface 103. Furthermore, after the singulation, an edge 12e (or a lateral surface) of the release layer 12 may be free from protruding out the lateral surface 103 (or an edge) of the carrier 10.

Figure 17:
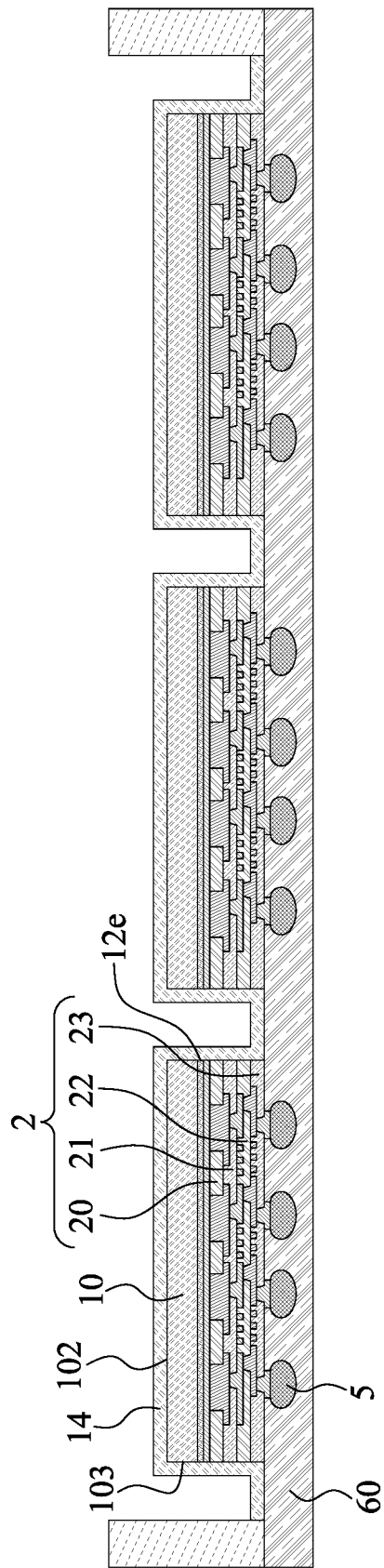
FIG. 17 shows one or more stages of an exemplary method for manufacturing an electronic package according to some embodiments of the present disclosure.

Referring to FIG. 17, the second circuit structure 2 along with the carrier 10 may be attached to a tape 60. The first connecting elements 5 may be sunk into the tape 60. A repelling layer 14 may be formed along the second surface 102 and the lateral surface 103 of the carrier 10, the edge 12e of the release layer 12, a lateral surface 203 of the second circuit structure 2, and the tape 60. Afterwards, the tape 60 and the repelling layer 14 thereon may be removed. In an alternative embodiment, during the removal of the tape 60, a portion of the repelling layer 14 on the lateral surface 203 of the second circuit structure 2 and adjacent to the tape 60 may be removed at the same time. As such, the repelling layer 14 may only cover a portion of the lateral surface 203 of the second circuit structure 2.

Figure 18:
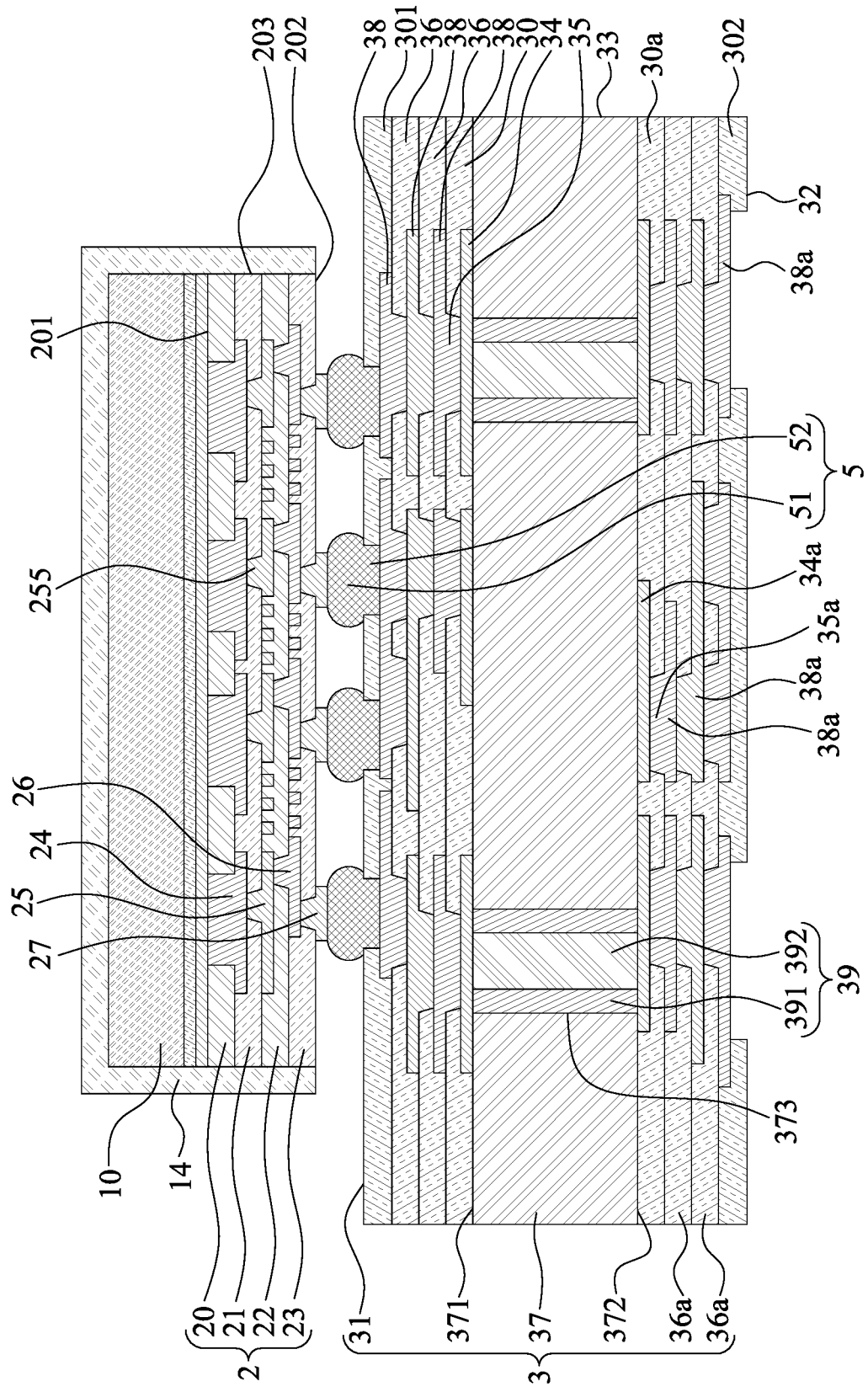
FIG. 18 shows one or more stages of an exemplary method for manufacturing an electronic package according to some embodiments of the present disclosure.

Referring to FIG. 18, the second circuit structure 2 may be attached to or bonded on a first circuit structure 3 by a flip chip (FC) bonding through the first connecting elements 5. The first circuit structure 3 may be a core substrate as shown in FIG. 1.

Figure 19:
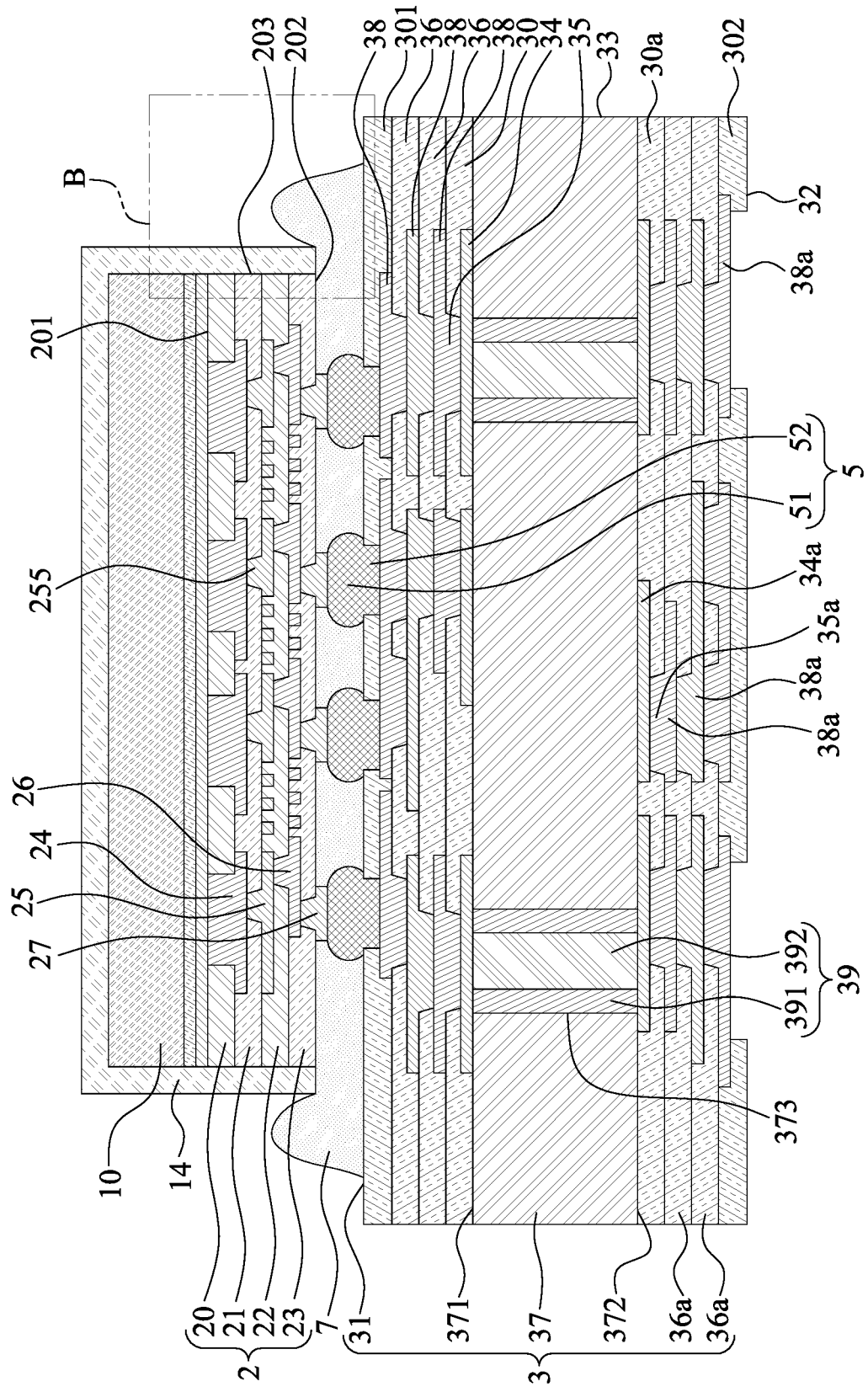
FIG. 19 shows one or more stages of an exemplary method for manufacturing an electronic package according to some embodiments of the present disclosure.

Referring to FIGS. 19 and 19A, a first underfill 7 may be formed or applied between the second circuit structure 2 and the first circuit structure 3. As shown in FIG. 19, the lateral surfaces 203 (or the edge) of the second circuit structure 2 and the carrier 10 may be covered by the repelling layer 14. The repelling layer 14 may have a bottom surface 142 substantially level with the bottom surface 202 of the second circuit structure 2. Alternatively, the bottom surface 142 of the repelling layer 14 may be higher than the bottom surface 202 of the second circuit structure 2 when a portion of the repelling layer 14 on the lateral surface 203 of the second circuit structure 2 is removed during the removal of the tape 60. The repelling layer 14 may have a lateral surface 143 substantially parallel with the lateral surface 103 of the carrier 10. FIG. 19A is a partially enlarged view of a region "B" in FIG. 19. The repelling layer 14 may include materials that modify the characteristics of the first underfill 7. The material of the repelling layer 14 may include for example but is not limited to, a release agent, such as Polytetrafluoroethylene (PTFE), fluorocarbon-based polymer, wax, etc. The material of the repelling layer 14 may include for example but is not limited to, a reagent which may be configured to alter the characteristic of the first underfill 7.

The repelling layer 14 may harden the first underfill 7 or modify a surface tension of the first underfill 7, such that the repelling layer 14 and the first underfill 7 may have poor adhesion. The first underfill 7 may be inhibited from contacting the lateral surface 143 of the repelling layer 14. The repelling layer 14 is formed on the lateral surface 103 of the carrier 10 prior to forming the first underfill 7 between the first circuit structure 3 and the second circuit structure 2. The repelling layer 14 may shape the profile of the first underfill 7 such as shown in FIG. 5. The first underfill 7 may include a first portion 7x having a substantially flat surface 7f which may be a top surface of the first portion 7x and a second portion 7y having a curved surface 7c. The first portion 7x may connect the second circuit structure 2 and the second portion 7y may connect the first portion 7x. The substantially flat surface 7f may be formed along the bottom surface 142 of the repelling layer 14. The underfill 7 may be inhibited from contacting the lateral surface 143 of the repelling layer 14, such that the second portion 7y (i.e., the curved surface 7c) is formed. A contact angle $\theta$ of the second portion 7y of the first underfill 7 on the repelling layer 14 may be greater than 90 degrees.

Figure 20:
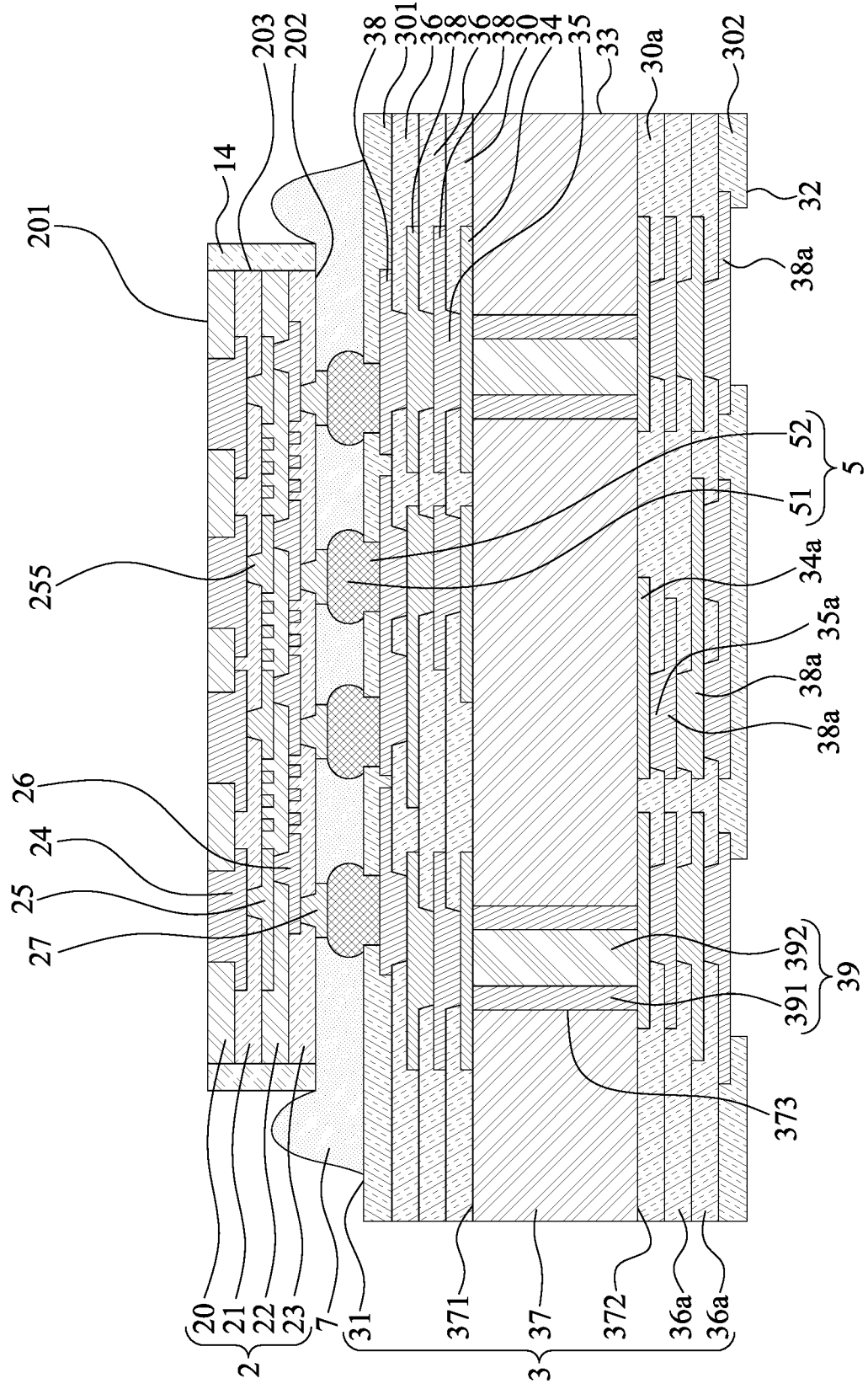
FIG. 20 shows one or more stages of an exemplary method for manufacturing an electronic package according to some embodiments of the present disclosure.

Referring to FIG. 20, the carrier 10, the release layer 12, and the seed layer 13 may be removed. A portion of the repelling layer 14 which attached to the carrier 10 may be removed at the same time. The top surface 201 of the second circuit structure 2 may be exposed.

In a comparative embodiment, an electronic component along with a temporary carrier may be attached to another electronic component to form an electronic package. Subsequently, an underfill material may be formed to reinforce the robustness thereof. However, the underfill material may creep onto an edge of the temporary carrier owing to the flexible, soft, or thermal-transformation characteristic of the underfill material. As such, the underfill material may hinder the de-bonding process of the temporary carrier. In the present disclosure, the repelling layer 14 is formed along the second circuit structure 2 and the carrier 10. The repelling layer 14 may be configured to inhibit the first underfill 7 from contacting the lateral surface 103 of the carrier 10. The particular profile of the first underfill 7 (such as, the first portion 7x having the substantially flat surface 7f and the second portion 7y having the curved surface 7c) may be consequently formed. As a result, the phenomenon of the underfill-creeping may be resolved and the de-bonding process of the carrier 10 may be performed without any difficulty.

Figure 21:
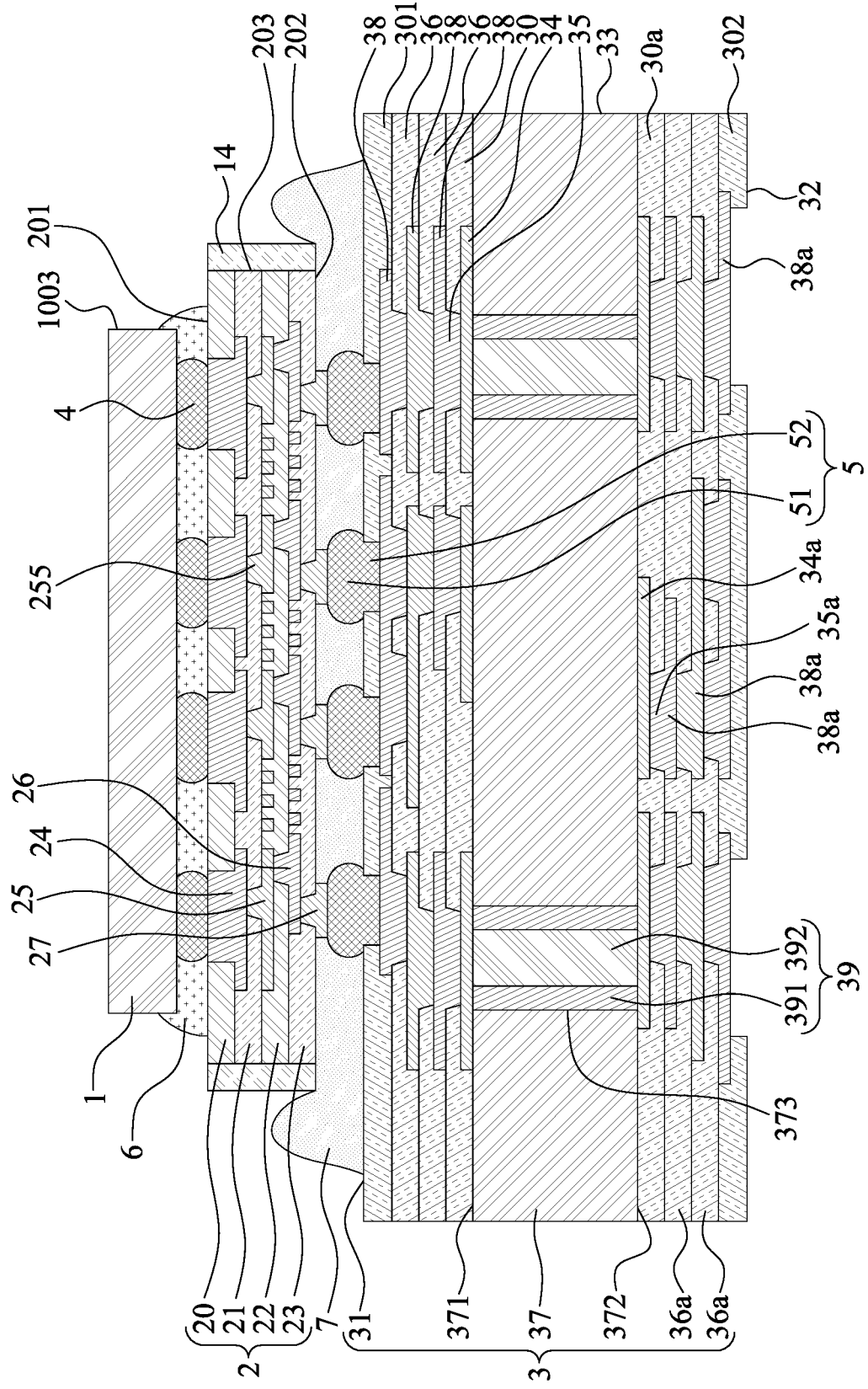
FIG. 21 shows one or more stages of an exemplary method for manufacturing an electronic package according to some embodiments of the present disclosure.

Referring to FIG. 21, an electronic device 1 may be attached to or bonded on the second circuit structure 2 through a plurality of second connecting elements 4. Afterwards, a second underfill 6 may be formed between the electronic device 1 and the second circuit structure 2 to form the electronic package similar to the electronic package 100 as illustrated in FIG. 1, FIG. 3, FIG. 4, and FIG. 5.

Figure 22:
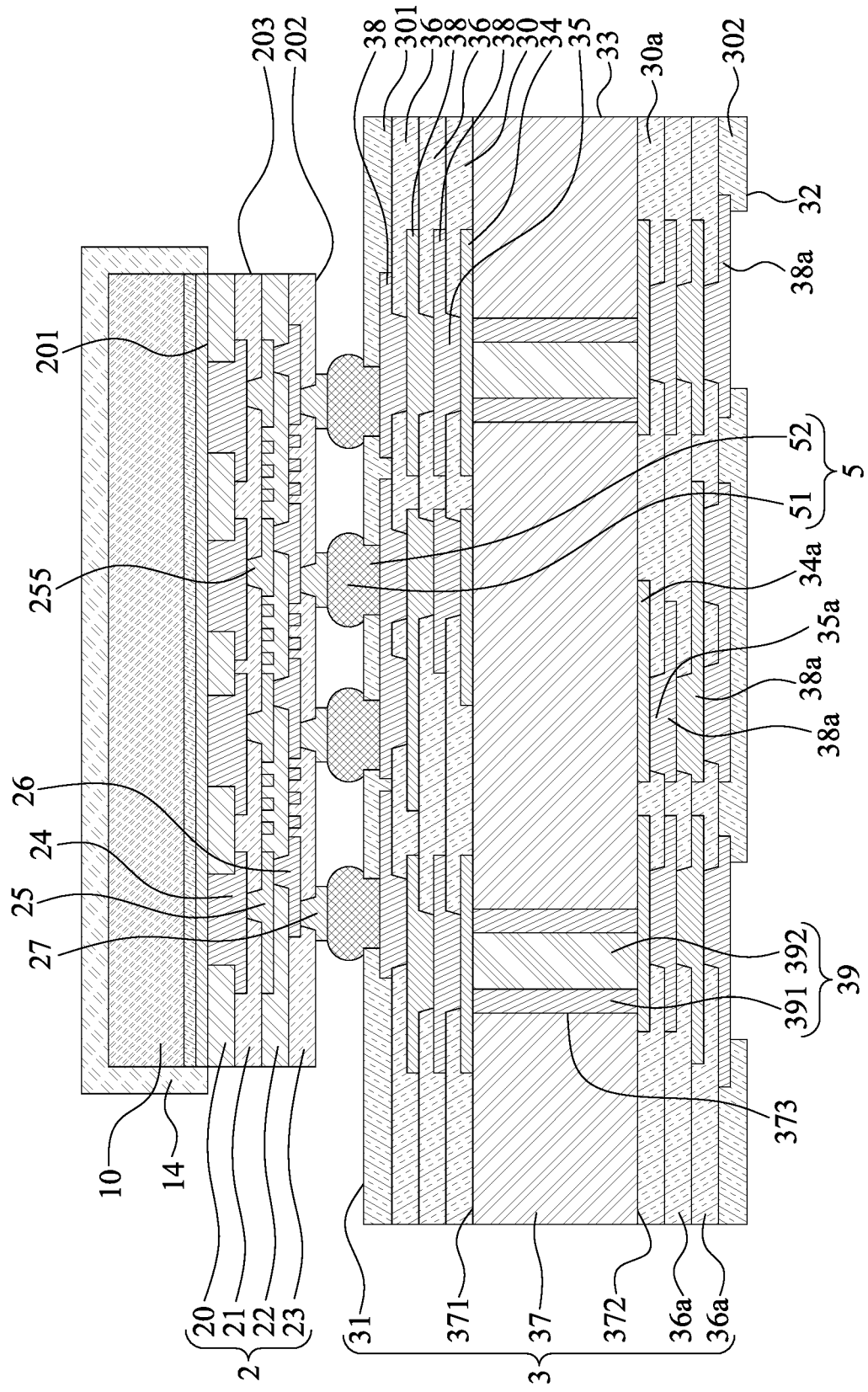
FIG. 22 shows one or more stages of an exemplary method for manufacturing an electronic package according to some embodiments of the present disclosure.

FIGS. 22 through 25 illustrate a method for manufacturing an electronic package according to some embodiments of the present disclosure. In some embodiments, the method is for manufacturing the electronic package 100 shown in FIG. 1 and FIG. 2. The initial stages of the illustrated process are the same as, or similar to, the stages illustrated in FIG. 14 to FIG. 17. FIG. 22 depicts a stage subsequent to that depicted in FIG. 17.

Referring to FIG. 22, the repelling layer 14 may only cover the lateral surface 103 of the carrier 10. The lateral surface 203 of the second circuit structure 2, a lateral surface of the release layer 12, and a lateral surface of the seed layer 13 may be exposed by the repelling layer 14. During the removal of the tape 60 as discussed in FIG. 17, the portion of the repelling layer 14 previously formed on the lateral surface 203 of the second circuit structure 2 may be removed by mechanical force or solvent.

Figure 23:
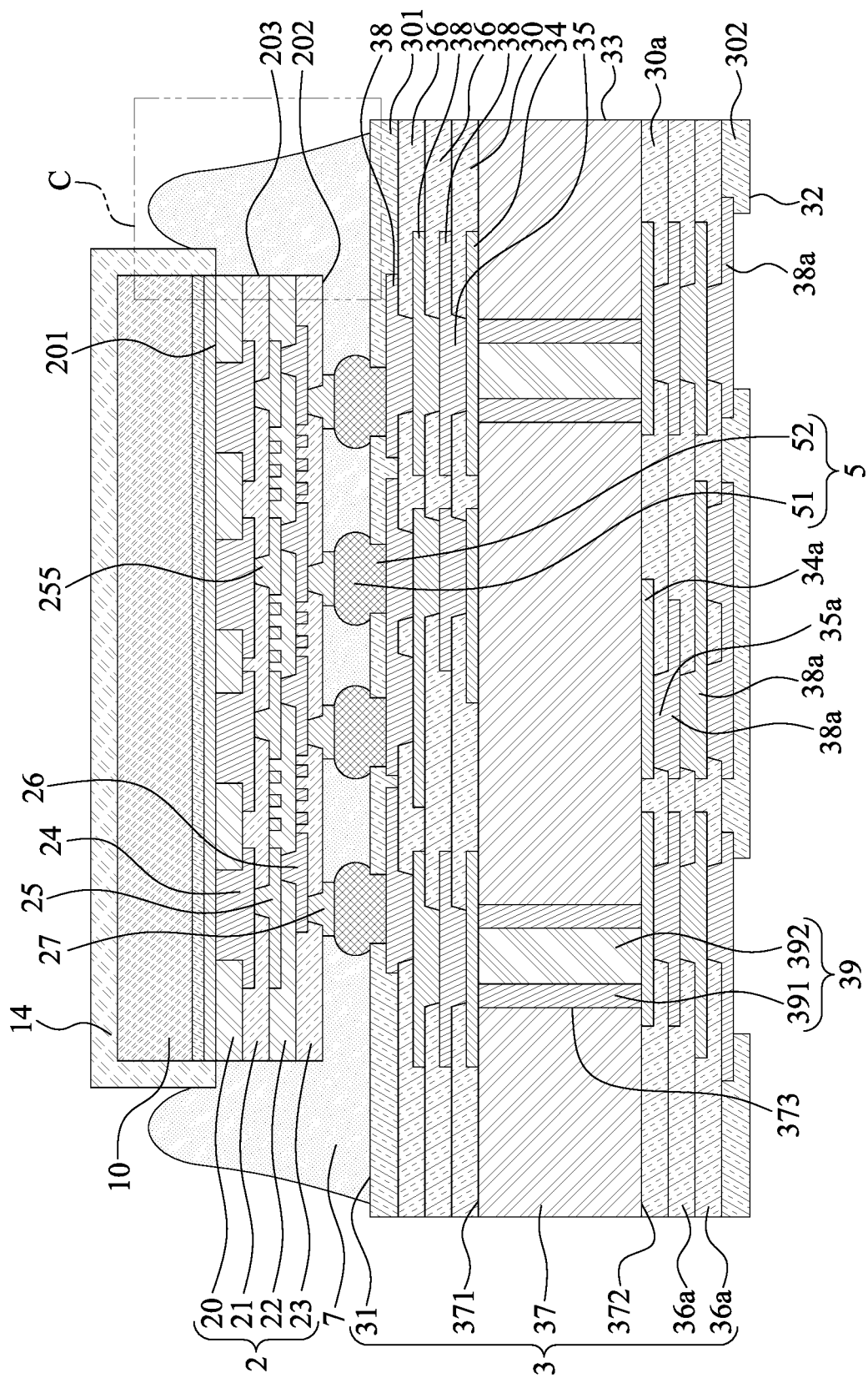
FIG. 23 shows one or more stages of an exemplary method for manufacturing an electronic package according to some embodiments of the present disclosure.

Referring to FIG. 23, the first underfill 7 may be formed or applied between the second circuit structure 2 and the first circuit structure 3 and may have a portion formed on the lateral surface 203 of the second circuit structure 2. FIG. 23A is a partially enlarged view of a region "C" in FIG. 23. The substantially flat surface 7f of the first underfill 7 may level with the top surface 201 of the second circuit structure 2, and the curved surface 7c of the first underfill 7 may be higher than the top surface 201 of the second circuit structure 2.

Figure 24:
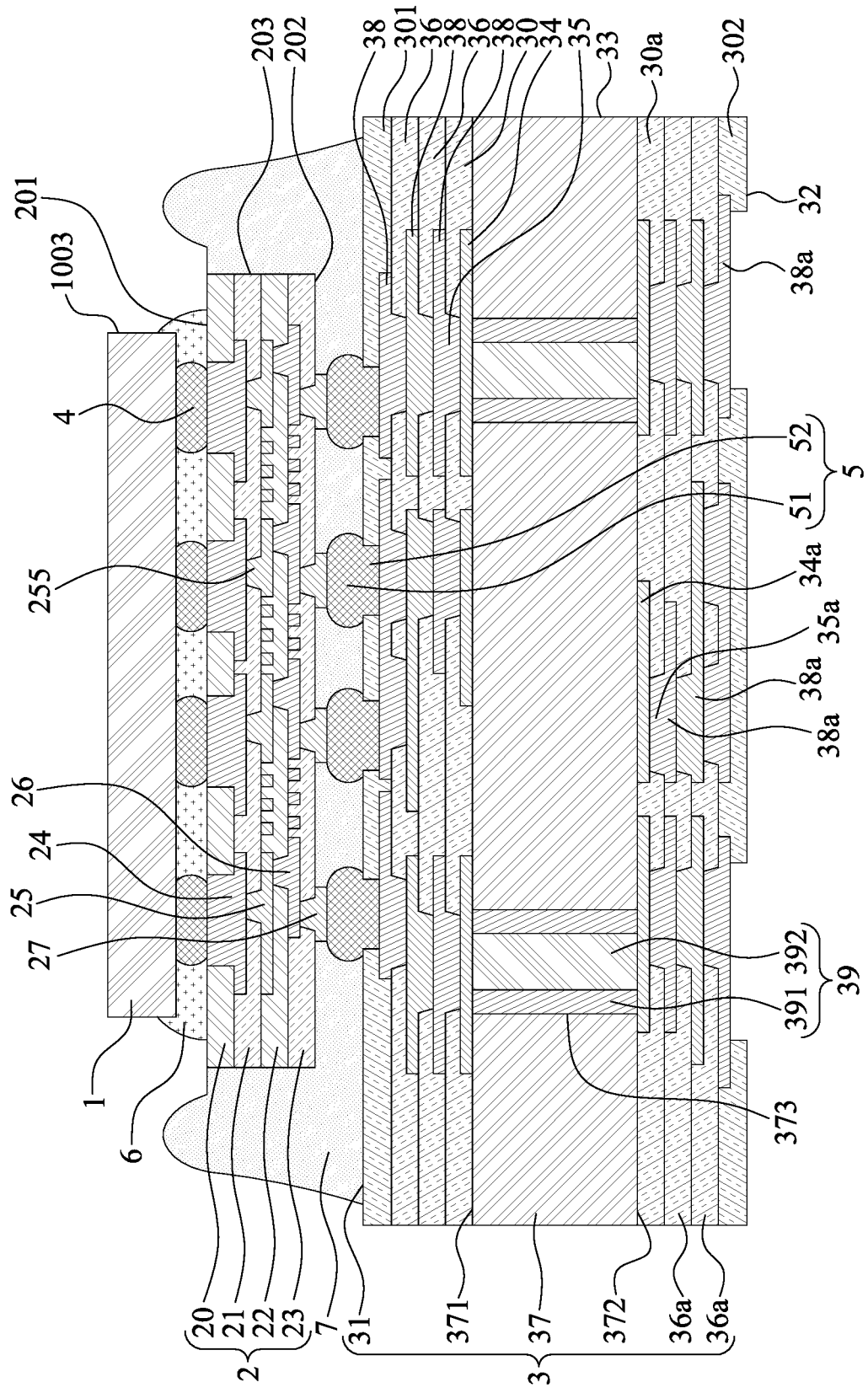
FIG. 24 shows one or more stages of an exemplary method for manufacturing an electronic package according to some embodiments of the present disclosure.

Referring to FIG. 24, the carrier 10, the release layer 12, and the seed layer 13 may be removed. A portion of the repelling layer 14 which attached to the carrier 10 may be removed at the same time. The top surface 201 of the second circuit structure 2 may be exposed. An electronic device 1 may be attached to or bonded on the second circuit structure 2 through a plurality of second connecting elements 4. Afterwards, a second underfill 6 may be formed between the electronic device 1 and the second circuit structure 2 to form the electronic package 100 as illustrated in FIG. 1 and FIG. 2.

Figure 25:
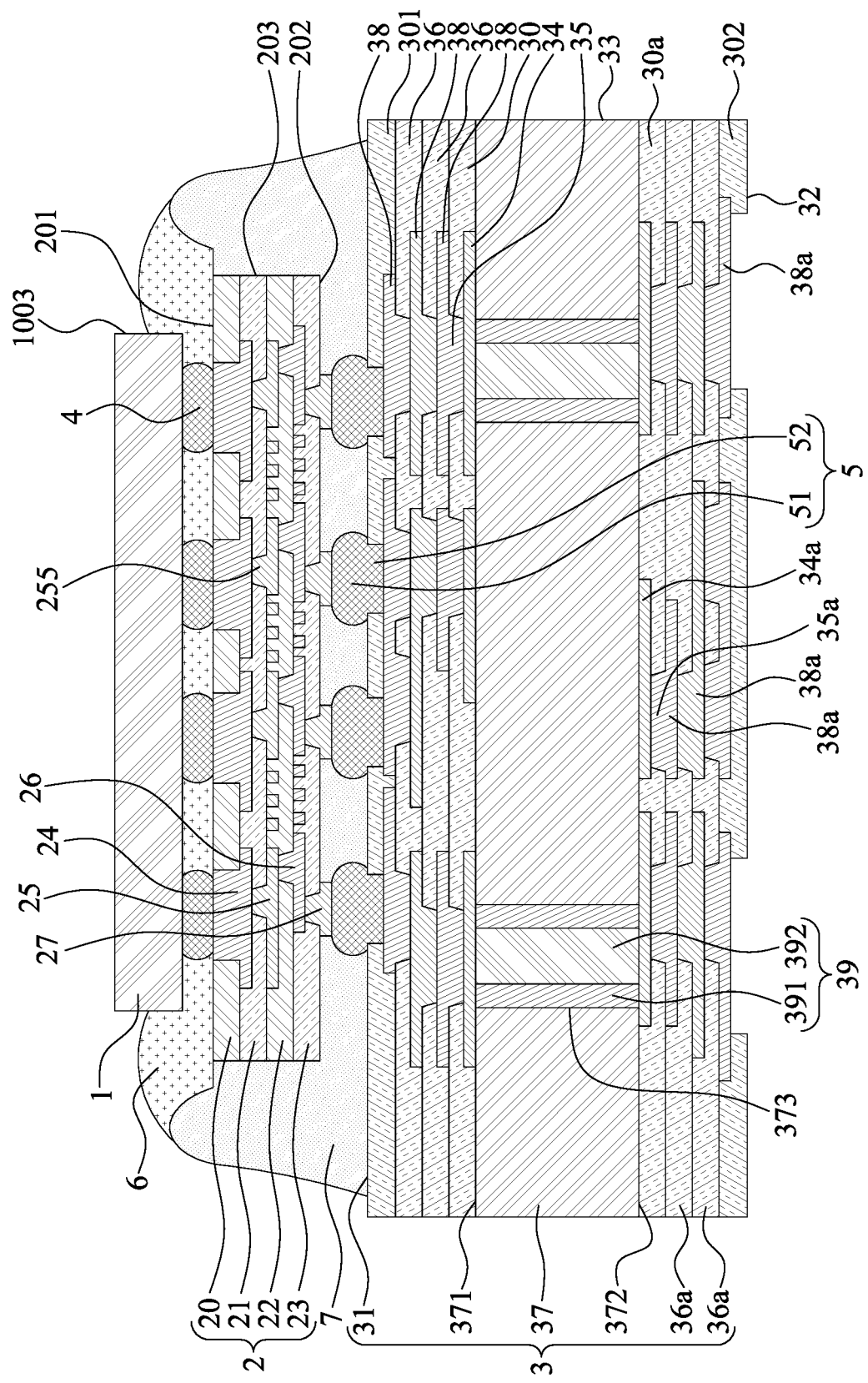
FIG. 25 shows one or more stages of an exemplary method for manufacturing an electronic package according to some embodiments of the present disclosure.

Referring to FIG. 25, the second underfill 6 may be formed on the first underfill 7. The second underfill 6 may contact the first underfill 7.

Figure 26:
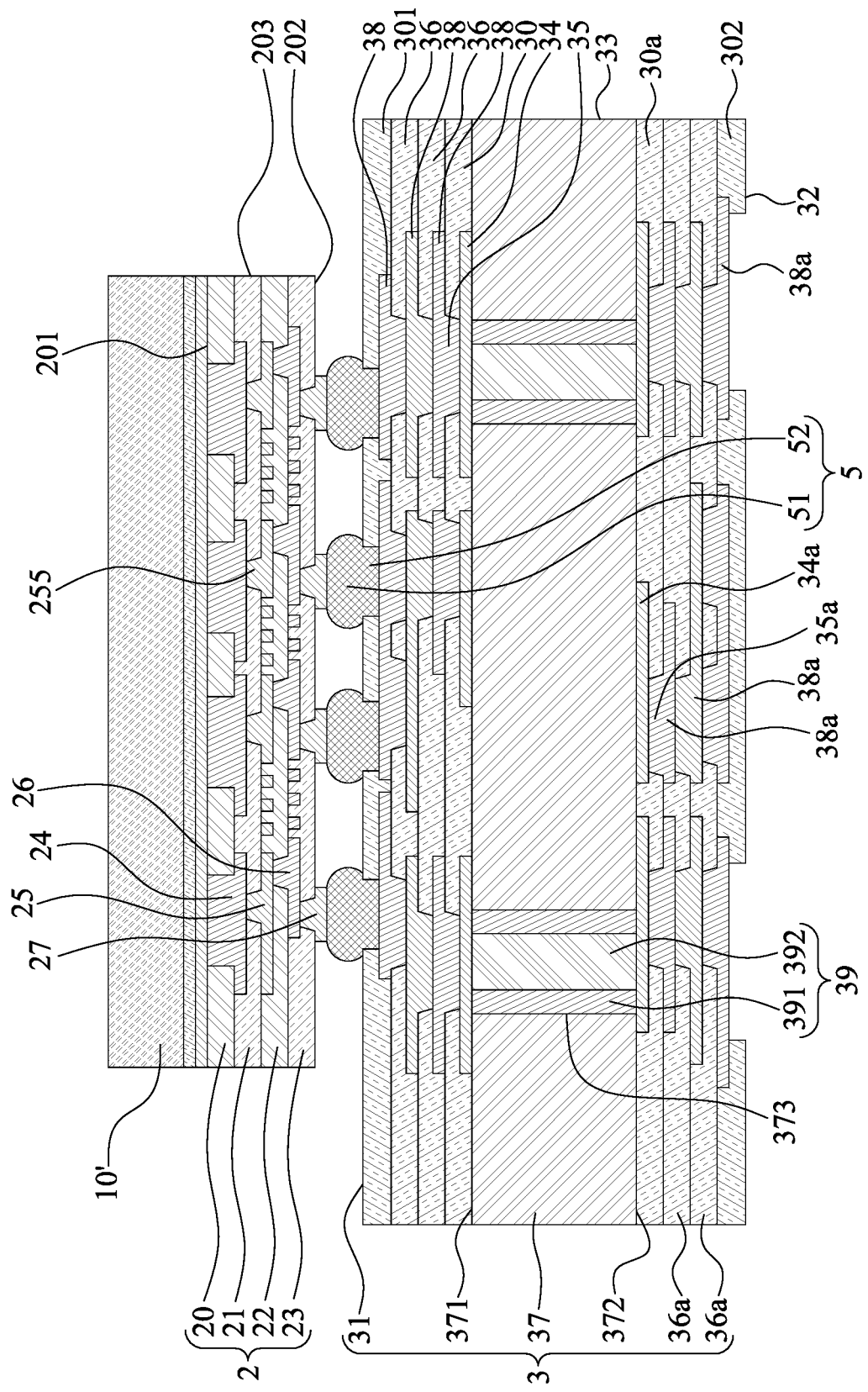
FIG. 26 shows one or more stages of an exemplary method for manufacturing an electronic package according to some embodiments of the present disclosure.
Figure 27:
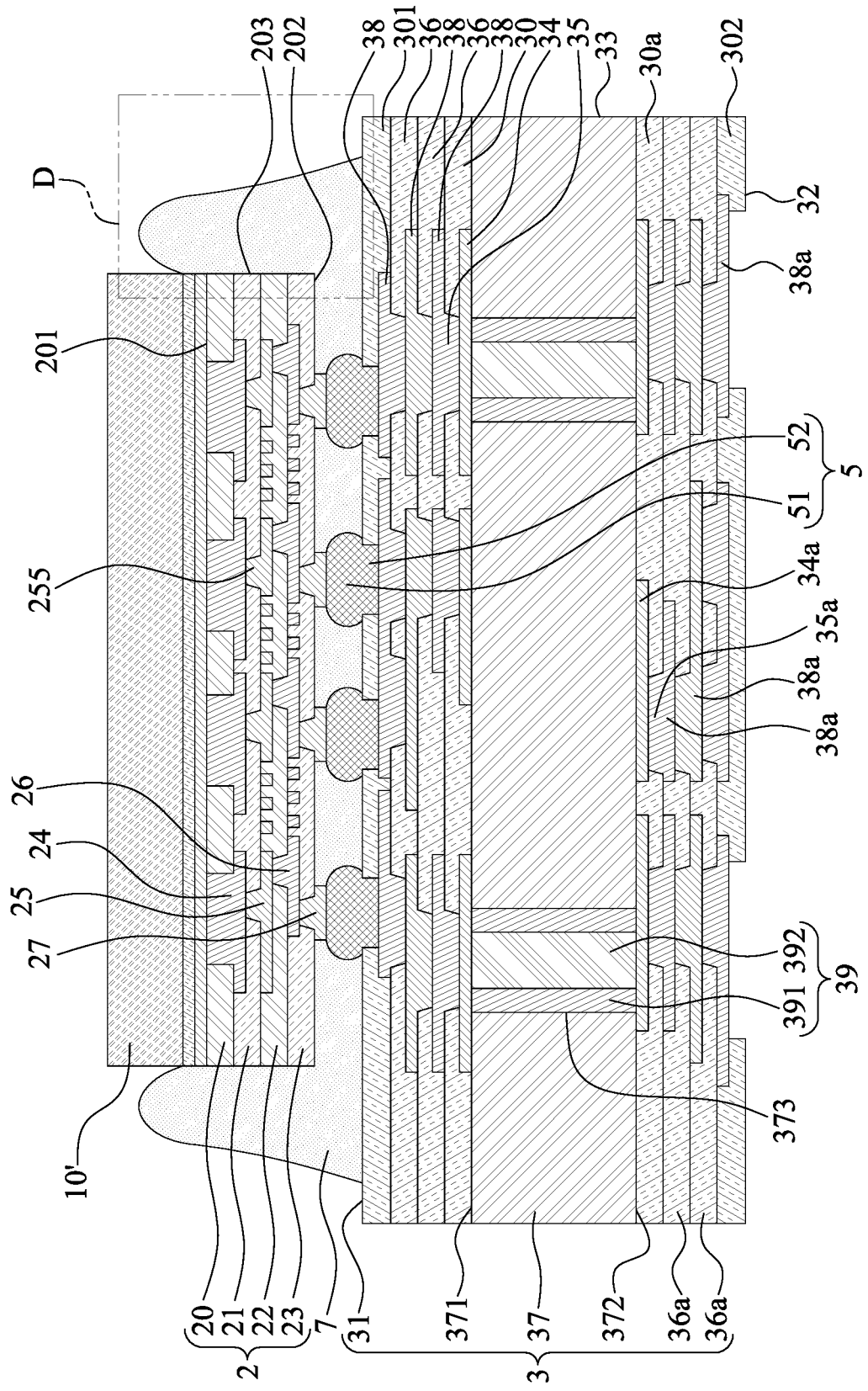
FIG. 27 shows one or more stages of an exemplary method for manufacturing an electronic package according to some embodiments of the present disclosure.

FIGS. 26 and 27 illustrate a method for manufacturing an electronic package according to some embodiments of the present disclosure. In some embodiments. The initial stages of the illustrated process are the same as, or similar to, the stages illustrated in FIG. 14 to FIG. 16. FIG. 26 depicts a stage subsequent to that depicted in FIG. 16.

Referring FIG. 26, the second circuit structure 2 along with a carrier 10' is attached to the first circuit structure 3 through the plurality of first connecting elements 5. The carrier 10' may include materials similar to the repelling layer 14 as illustrated previously.

Figure 27A:
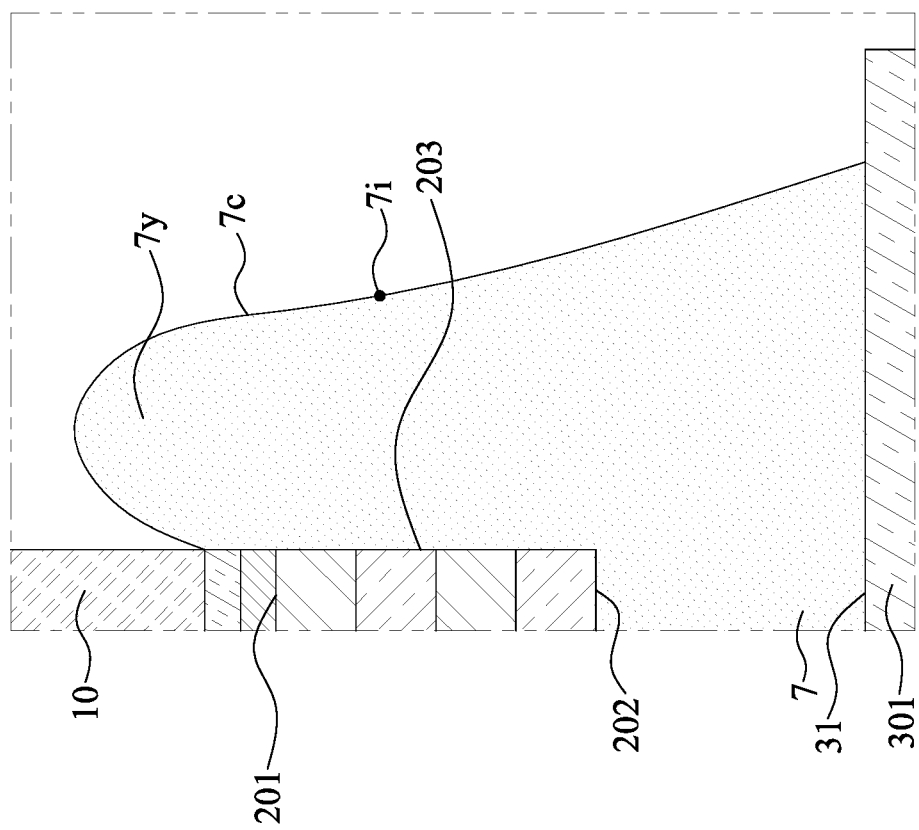
FIG. 27A is a partially enlarged view of a region "D" in FIG. 27.

Referring to FIG. 27, a first underfill 7 may be formed between the second circuit structure 2 and the first circuit structure 3 and a portion of the first underfill 7 may be formed on the lateral surface 203 of the second circuit structure 2. FIG. 27A is a partially enlarged view of a region "D" in FIG. 27. The first underfill 7 may have a second portion 7y connecting the second circuit structure 2 and having a curved surface 7c. The curved surface 7c may include an inflection point 7i. Then, the carrier 10', the release layer 12, and the seed layer 13 may be removed. An electronic device 1 is bonded to the second circuit structure 2. Afterwards, a second underfill 6 may be formed between the electronic device 1 and the second circuit structure 2 to form an electronic package similar to the electronic package 100 as illustrated in FIG. 1 and FIG. 6.

Figure 28:
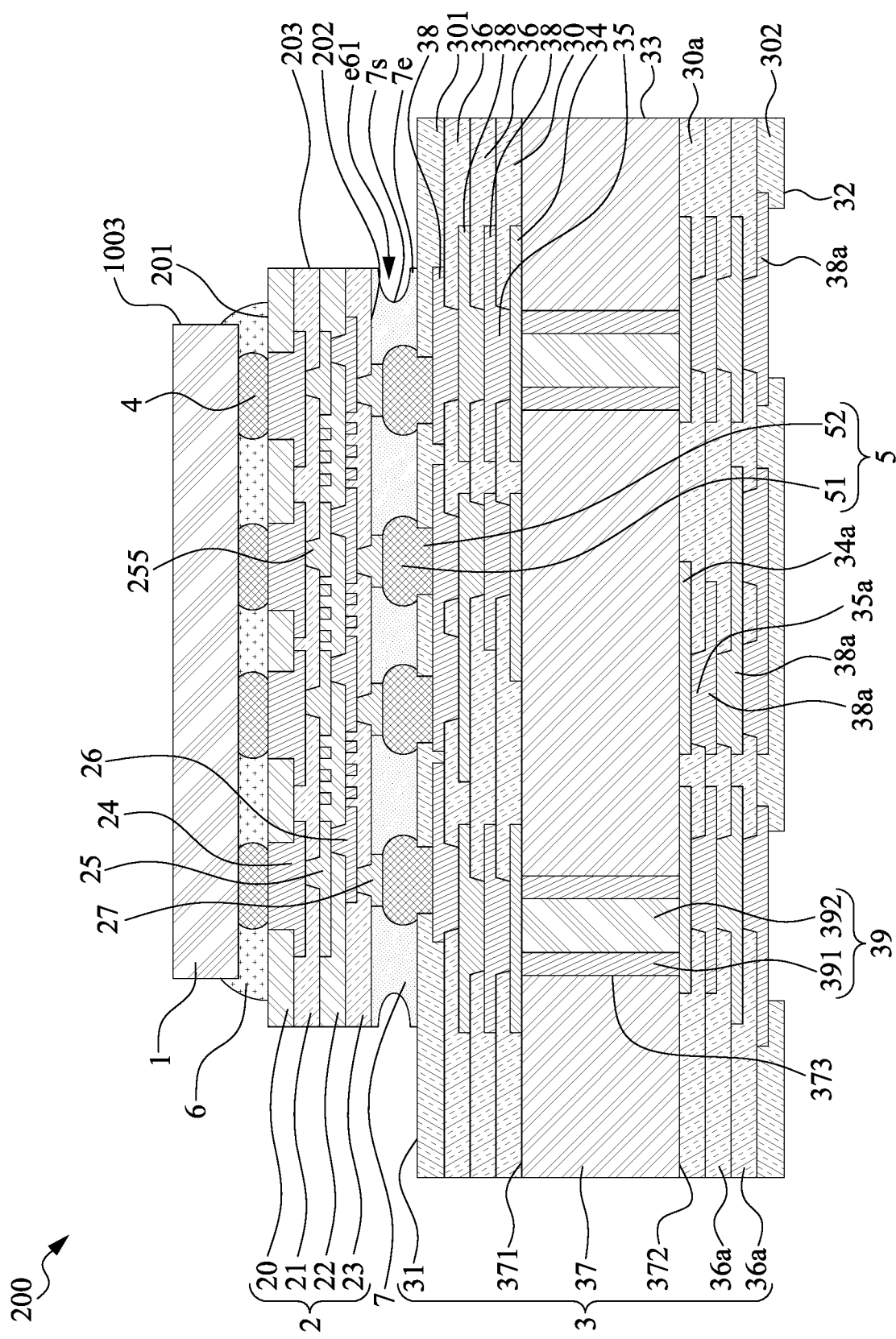
FIG. 28 is a cross-section of an electronic package according to some embodiments of the present disclosure.

FIG. 28 is a cross-section of an electronic package 200 according to some embodiments of the present disclosure. The electronic package 200 of FIG. 28 is similar to the electronic package 100 of FIG. 1, with differences therebetween as follows.

As shown in FIG. 28, the profile of the first underfill 7 is different from that of FIGS. 1-13. The first underfill 7 may include an edge portion 7e disposed adjacent to the lateral surface 203 of the second circuit structure 2. The edge portion 7e of the first underfill 7 may have a lateral surface 7s recessed from the lateral surface 203 of the second circuit structure 2. The lateral surface 7s may have a concave shape. The first underfill 7 may be free from contacting the lateral surface 203 of the second circuit structure 2. The first underfill 7 may include a non-conductive film (NCF).

Figure 29:
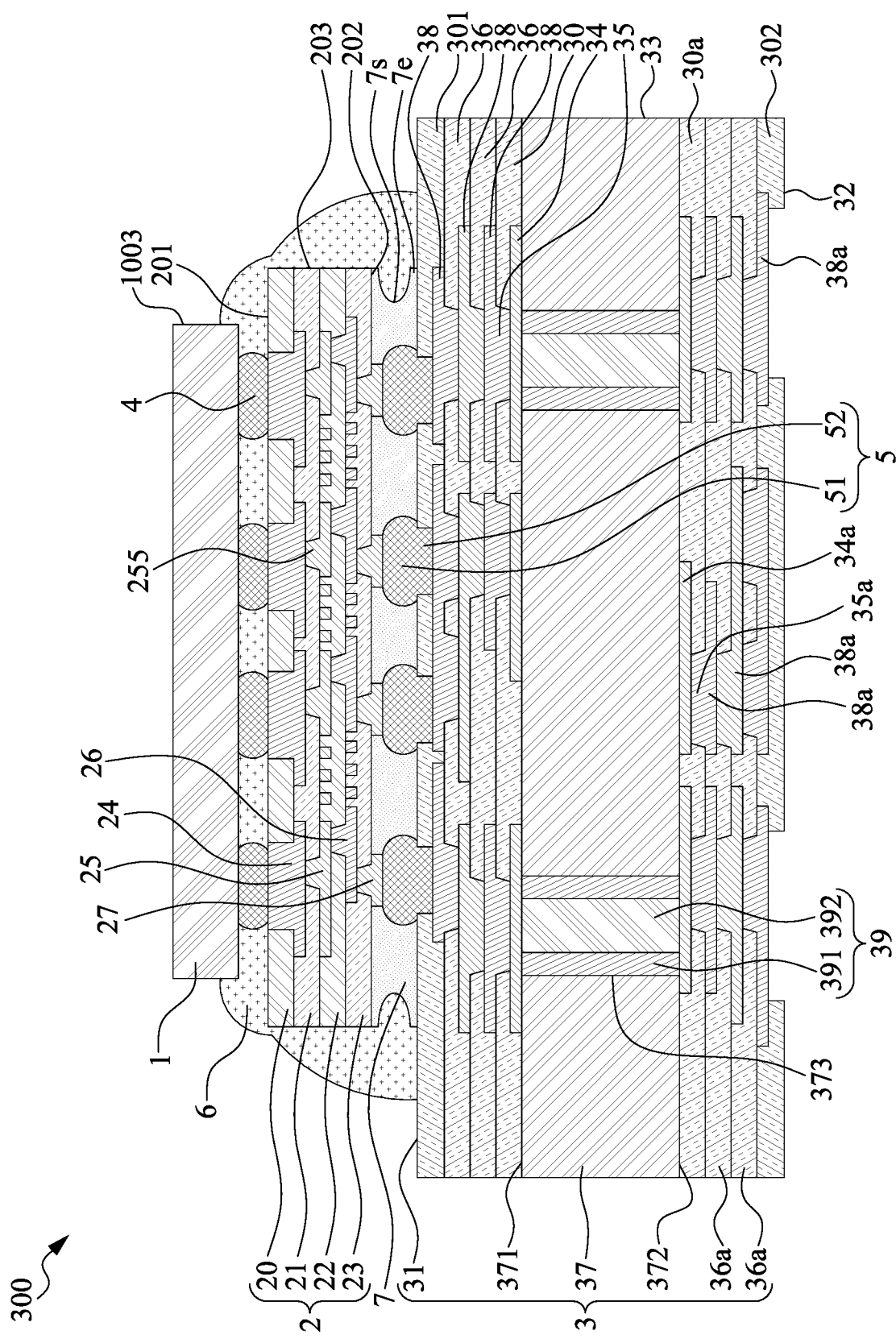
FIG. 29 is a cross-section of an electronic package according to some embodiments of the present disclosure.

FIG. 29 is a cross-section of an electronic package 300 according to some embodiments of the present disclosure. The electronic package 300 of FIG. 29 is similar to the electronic package 200 of FIG. 28, with differences therebetween as follows.

Referring to FIG. 29, the second underfill 6 may be formed on the lateral surface 203 of the second circuit structure 2 and the lateral surface 7s of the first underfill 7. The second underfill 6 may at least partially encapsulates the lateral surface 203 (or the edge) of the second circuit structure 2. As such, the robustness of the electronic package 300 may be improved.

FIG. 30 through FIG. 34 illustrate a method for manufacturing an electronic package according to some embodiments of the present disclosure. In some embodiments, the method is for manufacturing the electronic package 200 shown in FIG. 28.

Figure 30:
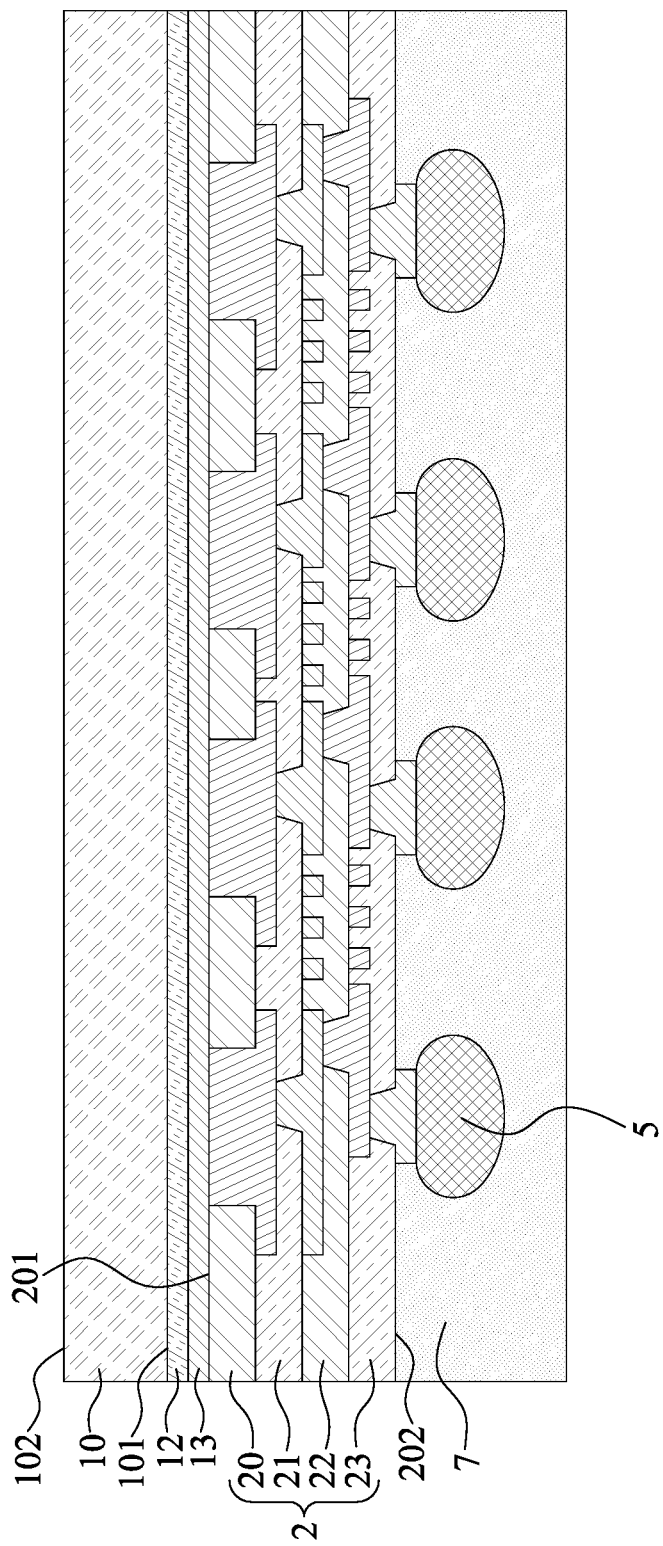
FIG. 30 shows one or more stages of an exemplary method for manufacturing an electronic package according to some embodiments of the present disclosure.

Referring to FIG. 30, a first underfill 7 is formed on (or attached to) the second circuit structure 2 after the second circuit structure 2 is formed on the carrier 10 through the release layer 12. The first underfill 7 is formed on the second circuit structure 2 prior to bonding the second circuit structure 2 to the first circuit structure 3. The first underfill 7 may be formed on the bottom surface 202 of the second circuit structure 2 and encapsulate the first connecting elements 5. The first underfill 7 may include a NCF.

Figure 31:
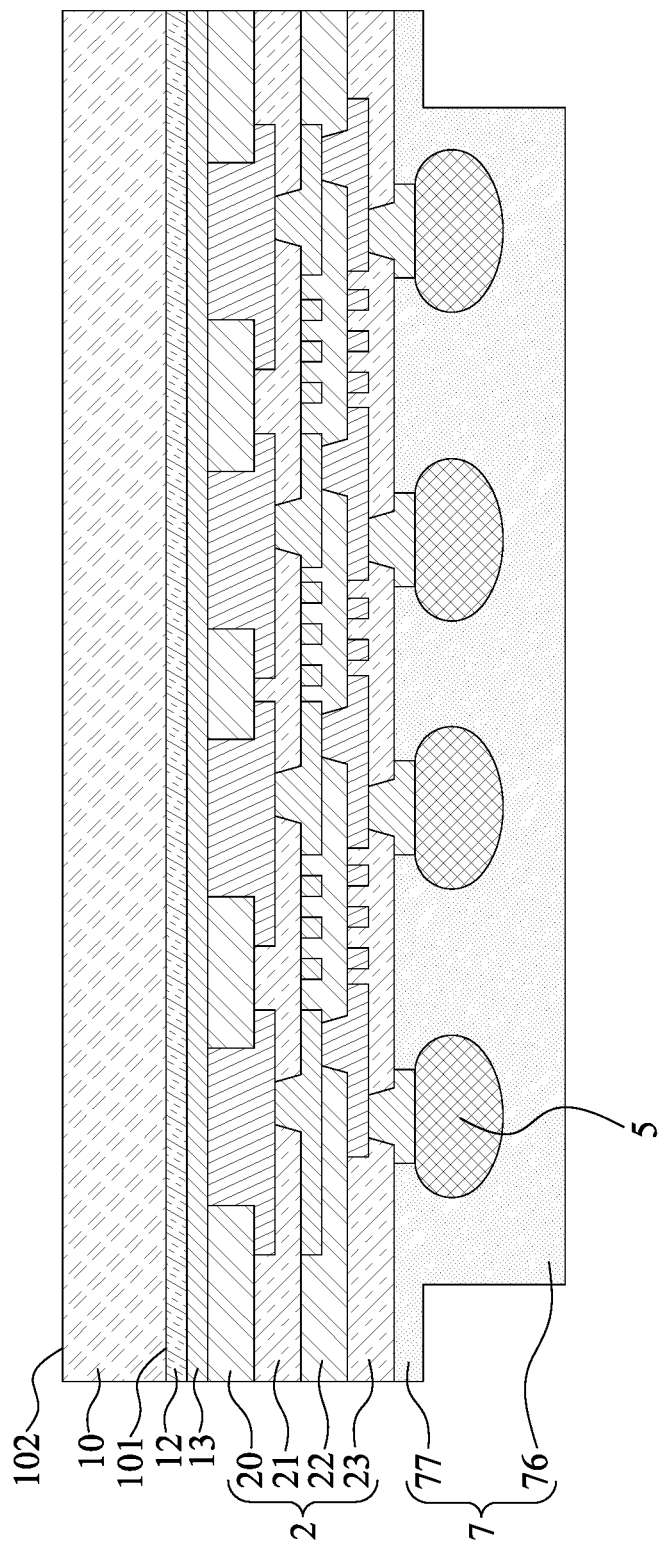
FIG. 31 shows one or more stages of an exemplary method for manufacturing an electronic package according to some embodiments of the present disclosure.

Referring to FIG. 31 the first underfill 7 (e.g., the NCF) may be partially removed to form a second part 77 thinner than a first part 71. Partial removal of the first underfill 7 may include performing optical half saw, mechanical half saw, photolithography or etching.

Figure 32:
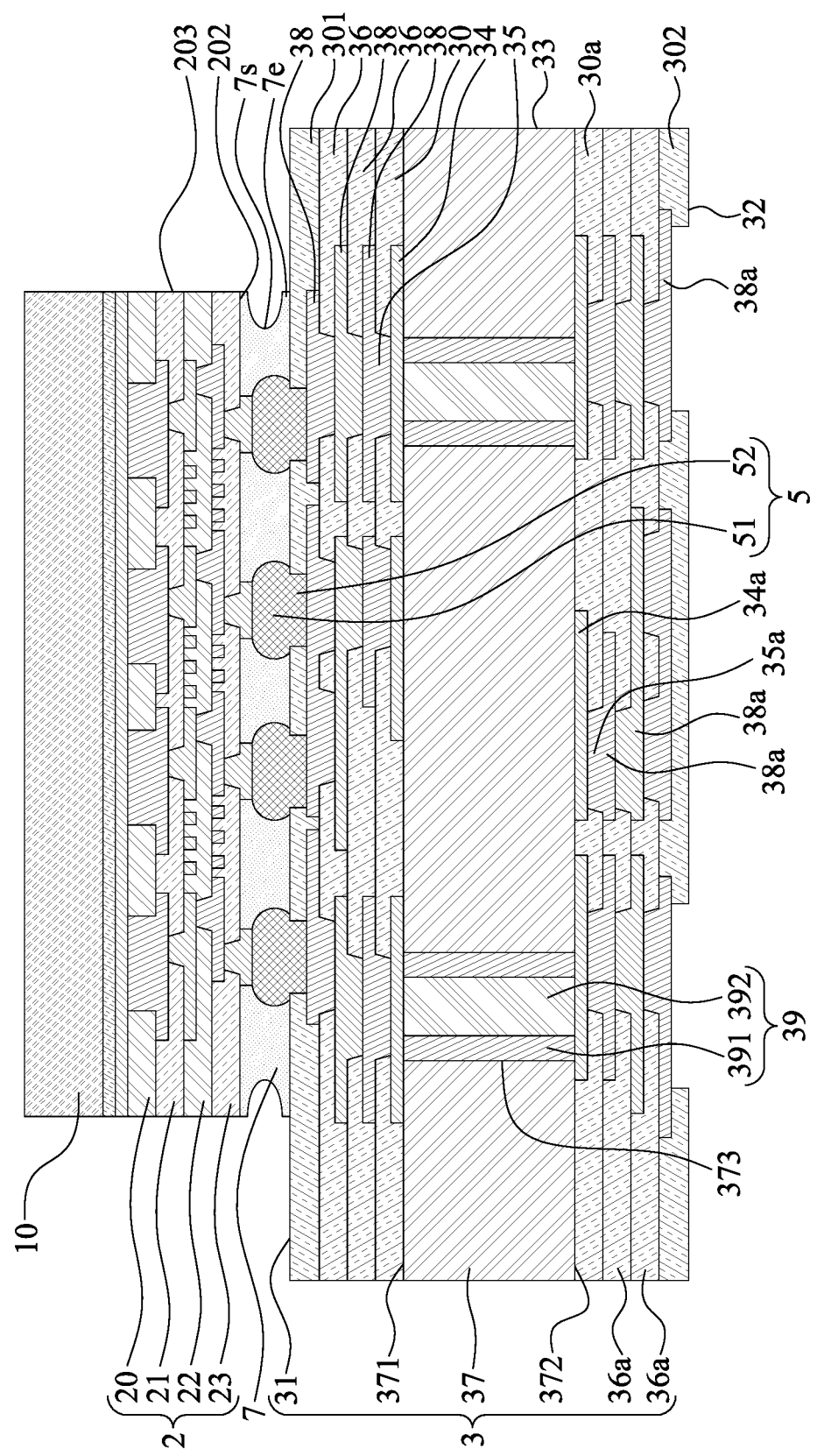
FIG. 32 shows one or more stages of an exemplary method for manufacturing an electronic package according to some embodiments of the present disclosure.

Referring to FIG. 32, the second circuit structure 2 along with the carrier 10 may be attached to or bonded on a first circuit structure 3 through the plurality of first connecting elements 5. The profile of first underfill 7 may be transformed owing to the heat or mechanical force induced during the bonding process of the second circuit structure 2. The first underfill 7 may include an edge portion 7e disposed adjacent to the lateral surface 203 of the second circuit structure 2. The edge portion 7e may have a lateral surface 7s recessed from the lateral surface 203 of the second circuit structure 20. The lateral surface 7s may have a concave shape.

Figure 33:
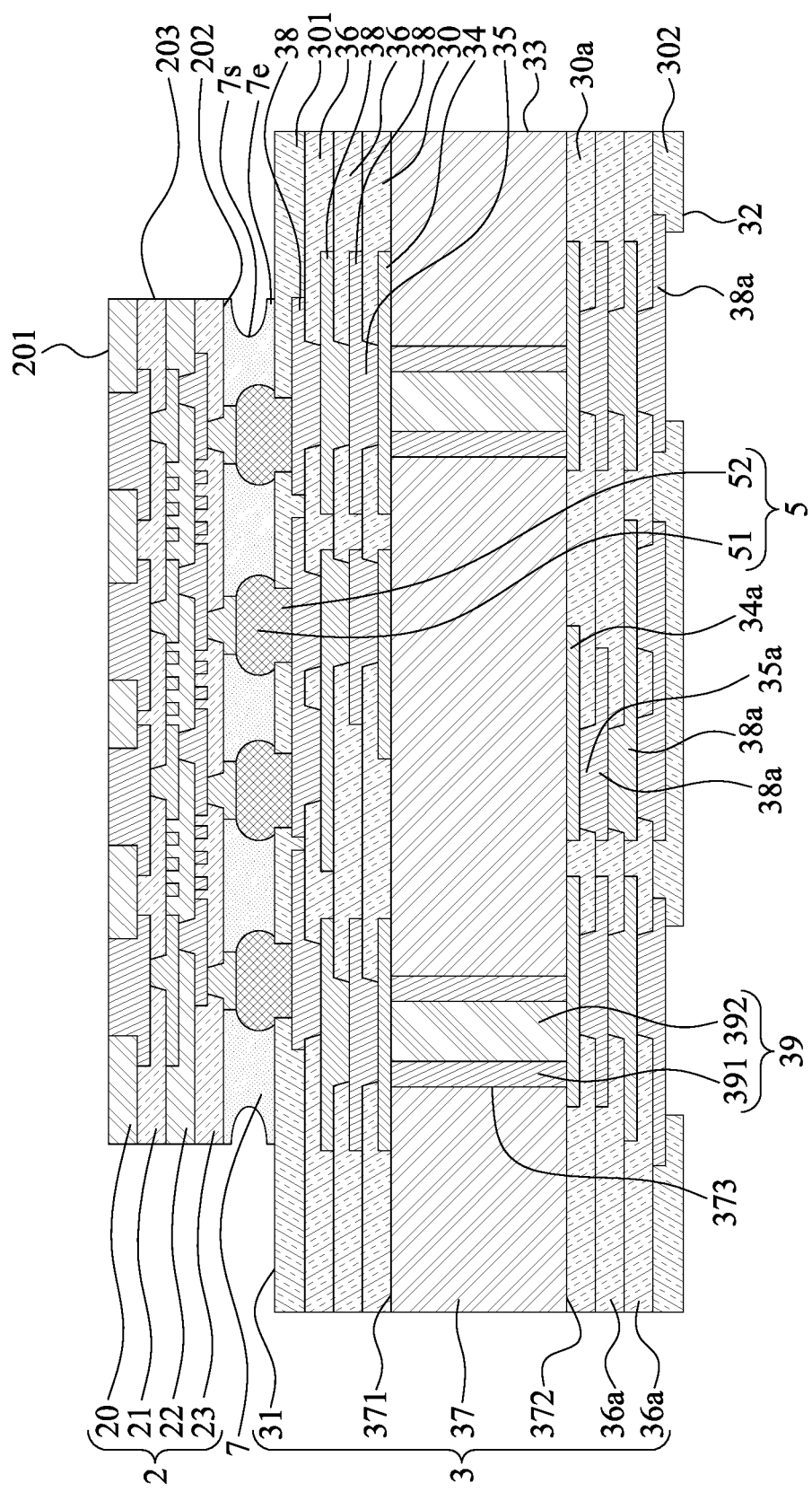
FIG. 33 shows one or more stages of an exemplary method for manufacturing an electronic package according to some embodiments of the present disclosure.

Referring to FIG. 33, the carrier 10, the release layer 12, and the seed layer 13 may be removed. The top surface 201 of the second circuit structure 2 may be exposed.

In a comparative embodiment, an electronic component along with a temporary carrier may be attached to anther electronic component to form an electronic package. Subsequently, an underfill material may be formed to reinforce the robustness thereof. However, the underfill material may creep onto an edge of the temporary carrier owing to the flexible or soft characteristic of the underfill material. As such, the underfill material may hinder the de-bonding process of the temporary carrier. In the present disclosure, the first underfill 7 may be formed and shaped prior to the bonding process of the second circuit structure 2. The second part 77 may be spaced apart from the top surface 31 of the first circuit structure 3. The stepped profile of the first underfill 7 may be transformed to form a recessed profile having a curved surface 7s. The first underfill 7 may be inhibited from contacting the lateral surface 203 of the second circuit structure 2. As a result, the phenomenon of the underfill-creeping may be resolved and the de-bonding process of the carrier 10 may be performed without any difficulty.

Figure 34:
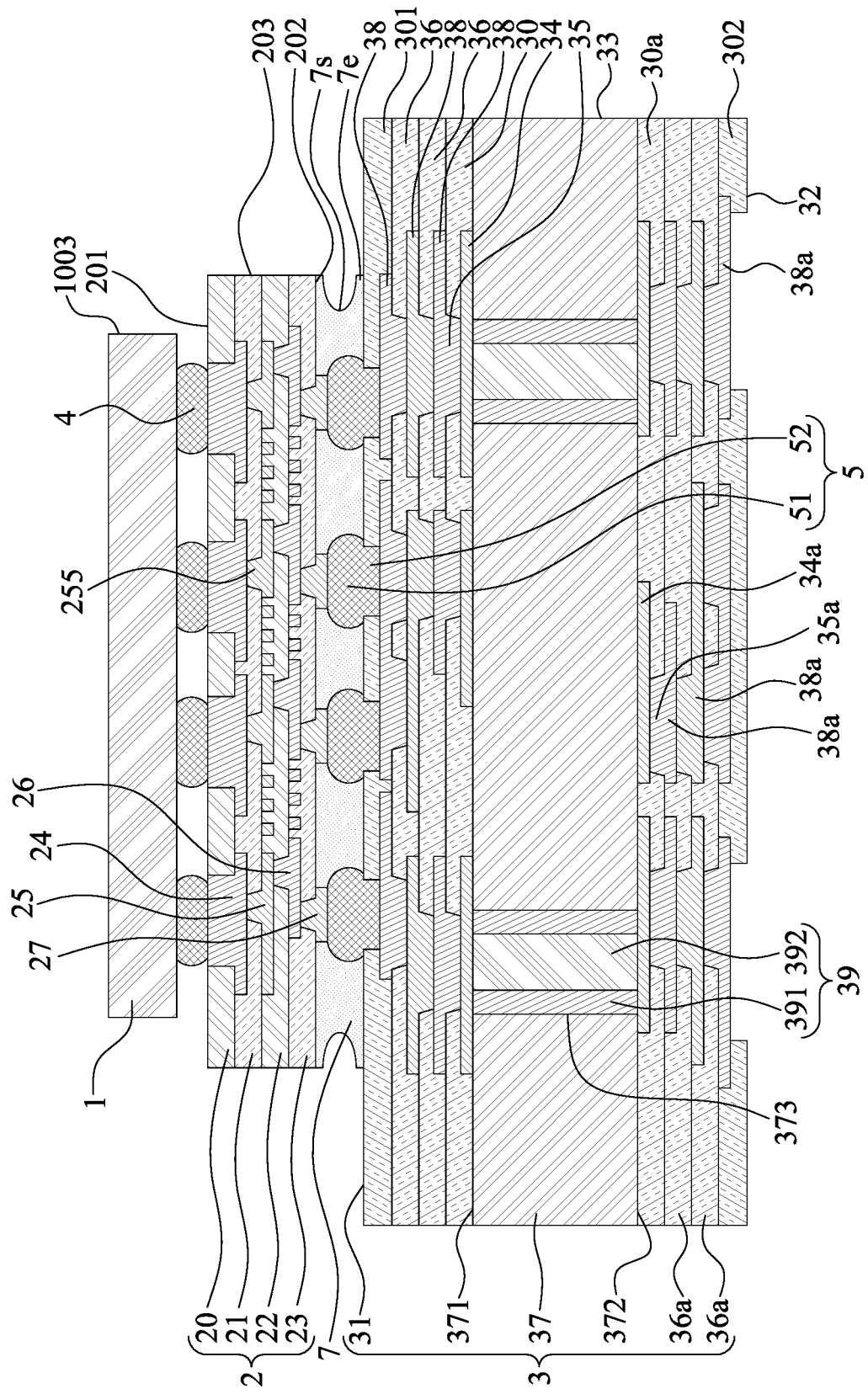
FIG. 34 shows one or more stages of an exemplary method for manufacturing an electronic package according to some embodiments of the present disclosure.

Referring to FIG. 34, an electronic device 1 may be attached to or bonded on the second circuit structure 2 through a plurality of second connecting elements 4. Afterwards, a second underfill 6 may be formed between the electronic device 1 and the second circuit structure 2 to form the electronic package 200 as illustrated in FIG. 28.

Figure 35:
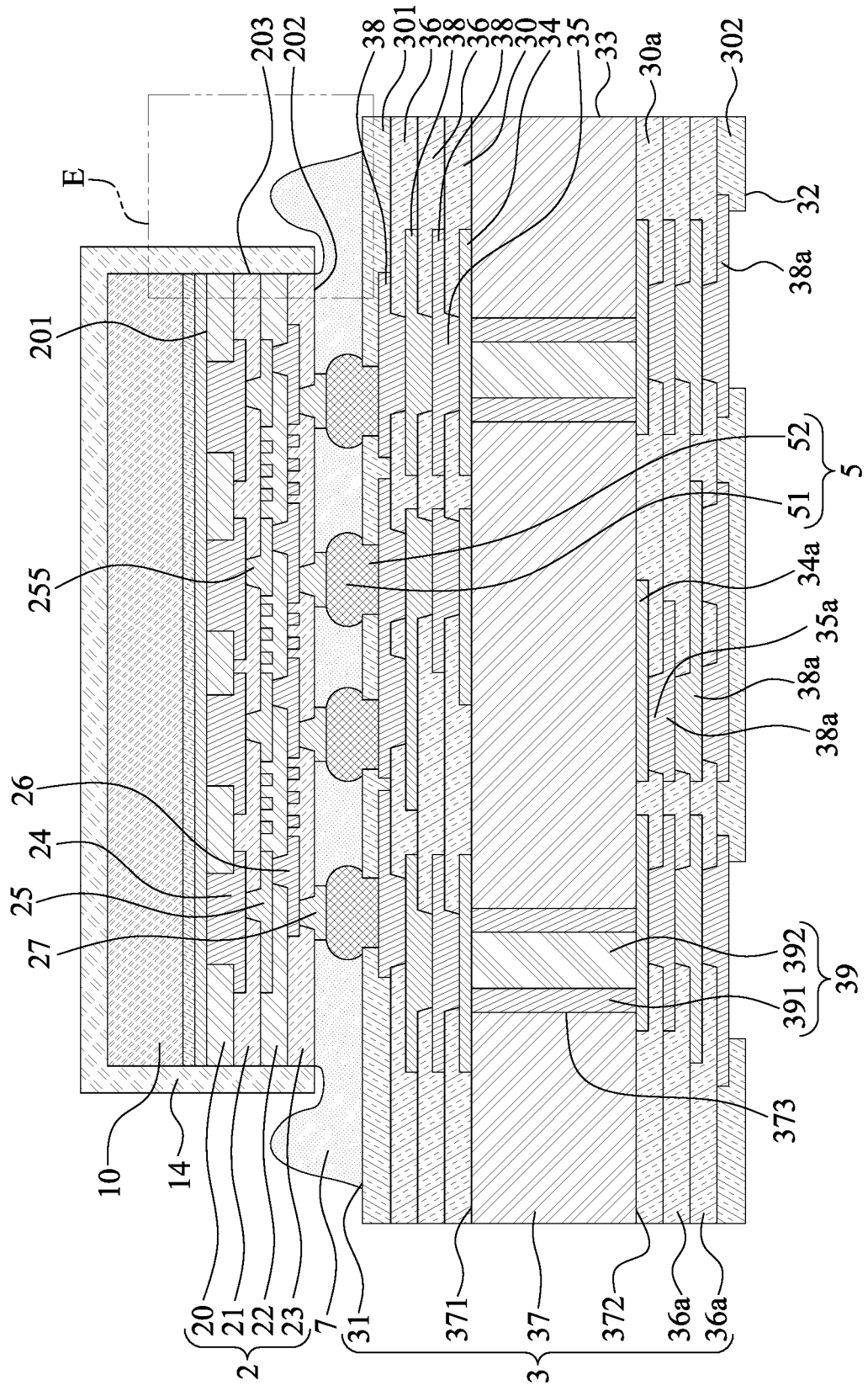
FIG. 35 shows one or more stages of an exemplary method for manufacturing an electronic package according to some embodiments of the present disclosure.
Figure 36:
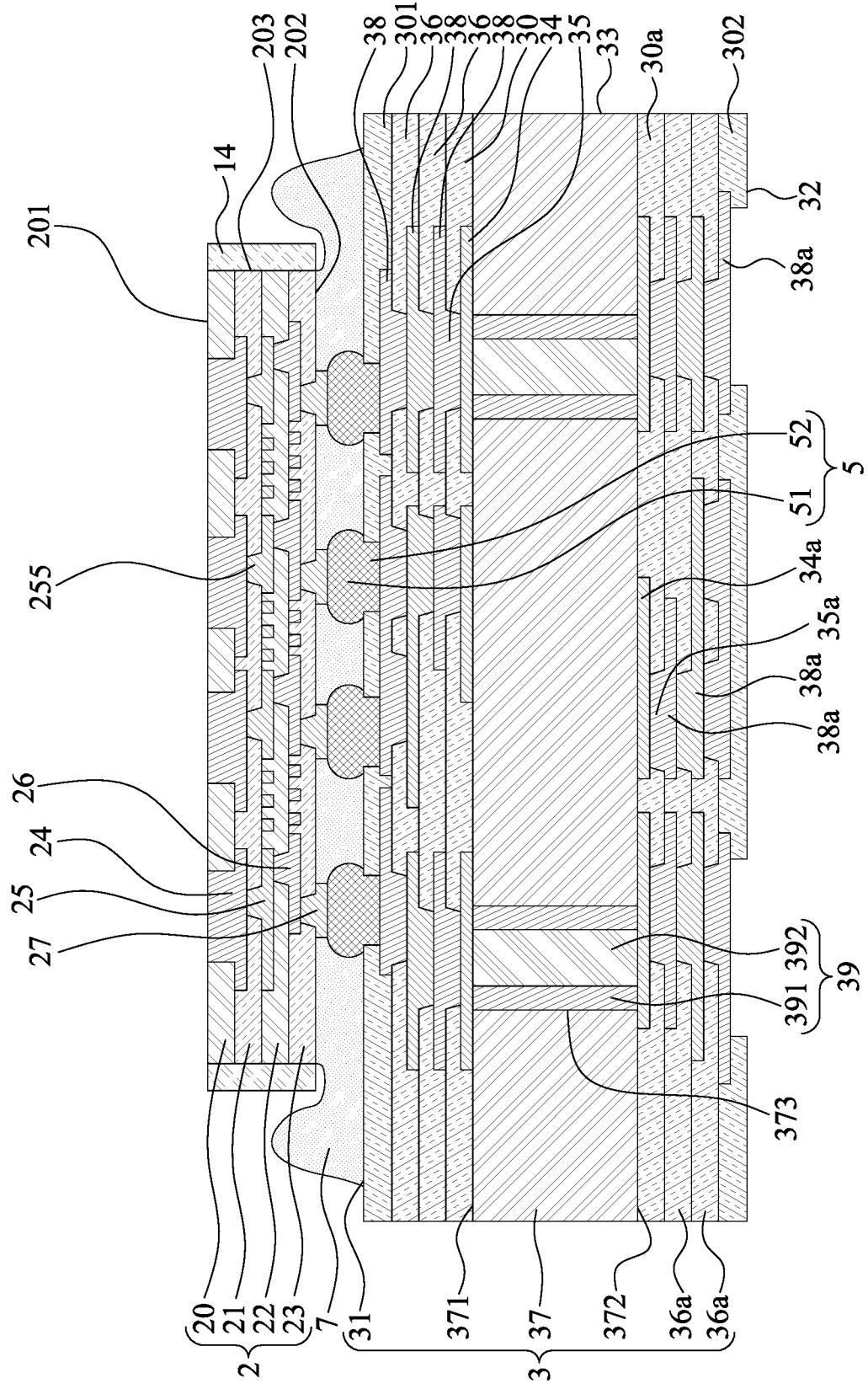
FIG. 36 is a cross-section of an electronic package according to some embodiments of the present disclosure.
Figure 37:
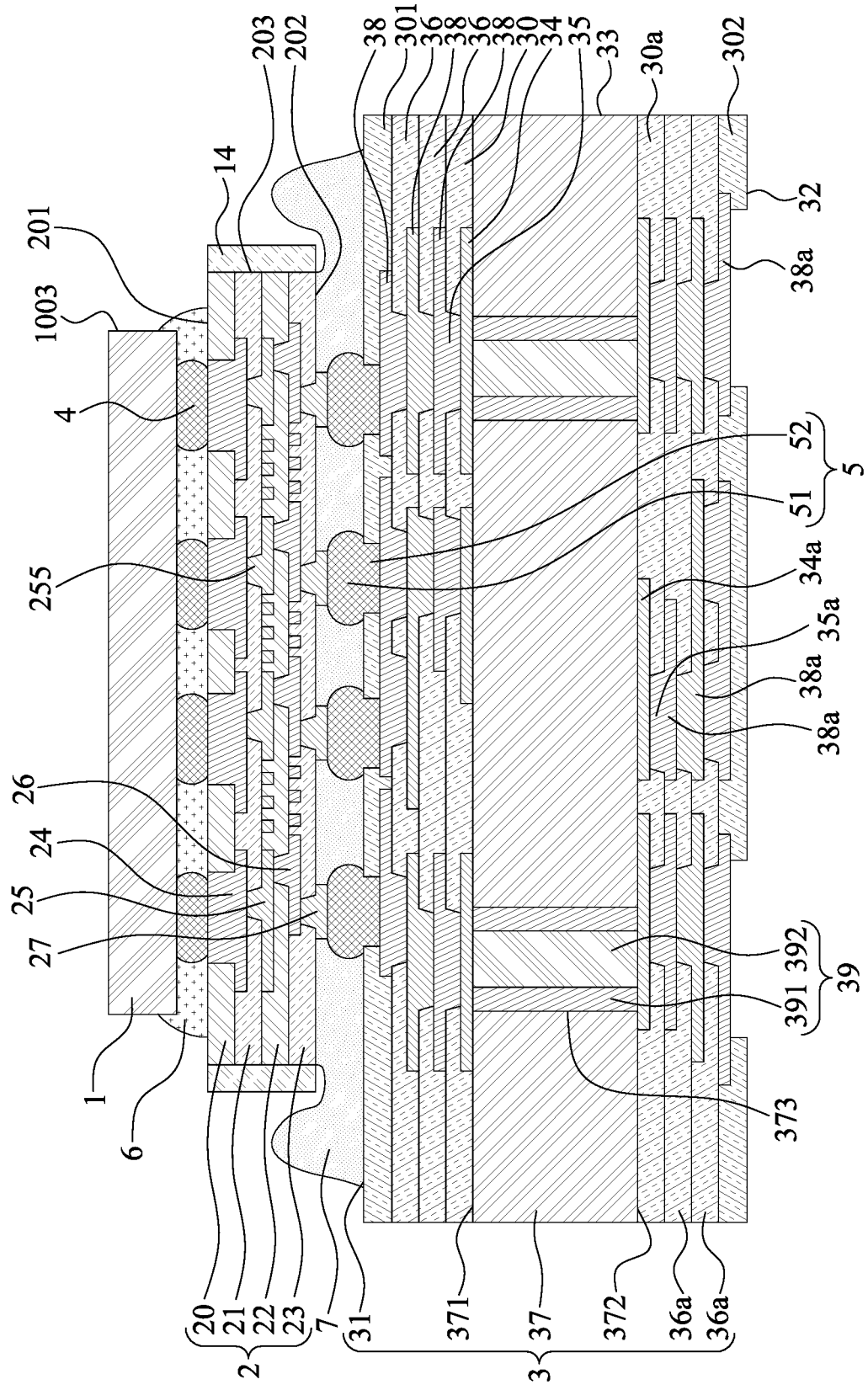
FIG. 37 is a cross-section of an electronic package according to some embodiments of the present disclosure.

FIG. 35 through FIG. 37 illustrate a method for manufacturing an electronic package according to some embodiments of the present disclosure. In some embodiments. The initial stages of the illustrated process are the same as, or similar to, the stages illustrated in FIG. 14 to FIG. 18. FIG. 35 depicts a stage subsequent to that depicted in FIG. 18.

Referring to FIG. 35, the first underfill 7 may be formed between the first circuit structure 3 and the second circuit structure 2. The first underfill 7 formed on the first circuit structure 3 may be performed subsequent to bonding the second circuit structure 2 to the first circuit structure 3.

FIG. 35A is a partially enlarged view of a region "E" in FIG. 35. As shown in FIG. 35, the lateral surfaces 203 (or the edge) of the second circuit structure 2 and the carrier 10 may be covered by the repelling layer 14. The bottom surface 142 of the repelling layer 14 may substantially level with the bottom surface 202 of the second circuit structure 2. As shown in FIG. 35, the material of the repelling layer 14 may include for example but is not limited to, a release agent, such as Polytetrafluoroethylene (PTFE), fluorocarbon-based polymer, wax, etc. The material of the repelling layer 14 may include for example but is not limited to, a reagent which may be configured to alter the characteristic of the first underfill 7.

The repelling layer 14 may harden the first underfill 7 or modify a surface tension of the first underfill 7, such that the repelling layer 14 and the first underfill 7 may have poor adhesion. The first underfill 7 may be inhibited from contacting the bottom surface 142 and the lateral surface 143 of the repelling layer 14. The repelling layer 14 is formed on the lateral surface 103 of the carrier 10 prior to forming the first underfill 7 between the first circuit structure 3 and the second circuit structure 2. The repelling layer 14 may shape the profile of the first underfill 7, as shown in FIG. 8.

Referring to FIG. 36, the carrier 10, the release layer 12, and the seed layer 13 may be removed. A portion of the repelling layer 14 which attached to the carrier 10 may be removed at the same time. The top surface 201 of the second circuit structure 2 may be exposed.

In a comparative embodiment, an electronic component along with a temporary carrier may be attached to another electronic component to form an electronic package. Subsequently, an underfill material may be formed to reinforce the robustness thereof. However, the underfill material may creep onto an edge of the temporary carrier owing to the flexible, soft, or thermal-transformation characteristic of the underfill material. As such, the underfill material may hinder the de-bonding process of the temporary carrier. In the present disclosure, the repelling layer 14 is formed along the second circuit structure 2 and the carrier 10. The repelling layer 14 may be configured to inhibit the first underfill 7 from contacting the lateral surface 103 of the carrier 10. The particular profile of the first underfill 7 (such as, the inner portion 7x having the step portion 7t and the outer portion 7y having the curved surface 7c) may be consequently formed. As a result, the phenomenon of the underfill-creeping may be resolved and the de-bonding process of the carrier 10 may be performed without any difficulty.

Referring to FIG. 37, an electronic device 1 may be attached to or bonded on the second circuit structure 2 through a plurality of second connecting elements 4. Afterwards, a second underfill 6 may be formed between the electronic device 1 and the second circuit structure 2 to form an electronic package similar to the electronic package 100 as illustrated in FIG. 1 and FIG. 8.

Figure 38:
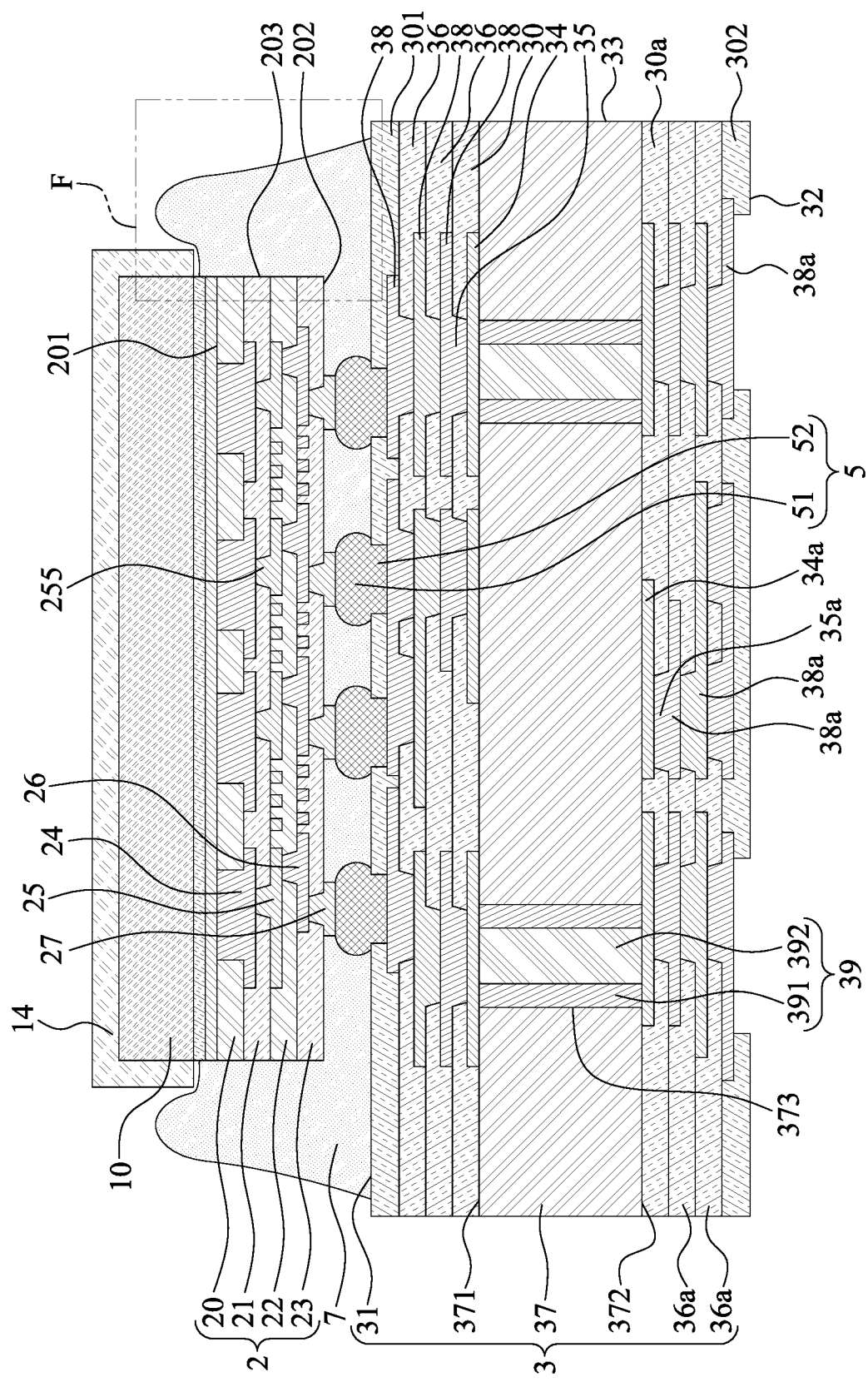
FIG. 38 shows one or more stages of an exemplary method for manufacturing an electronic package according to some embodiments of the present disclosure.
Figure 38A:
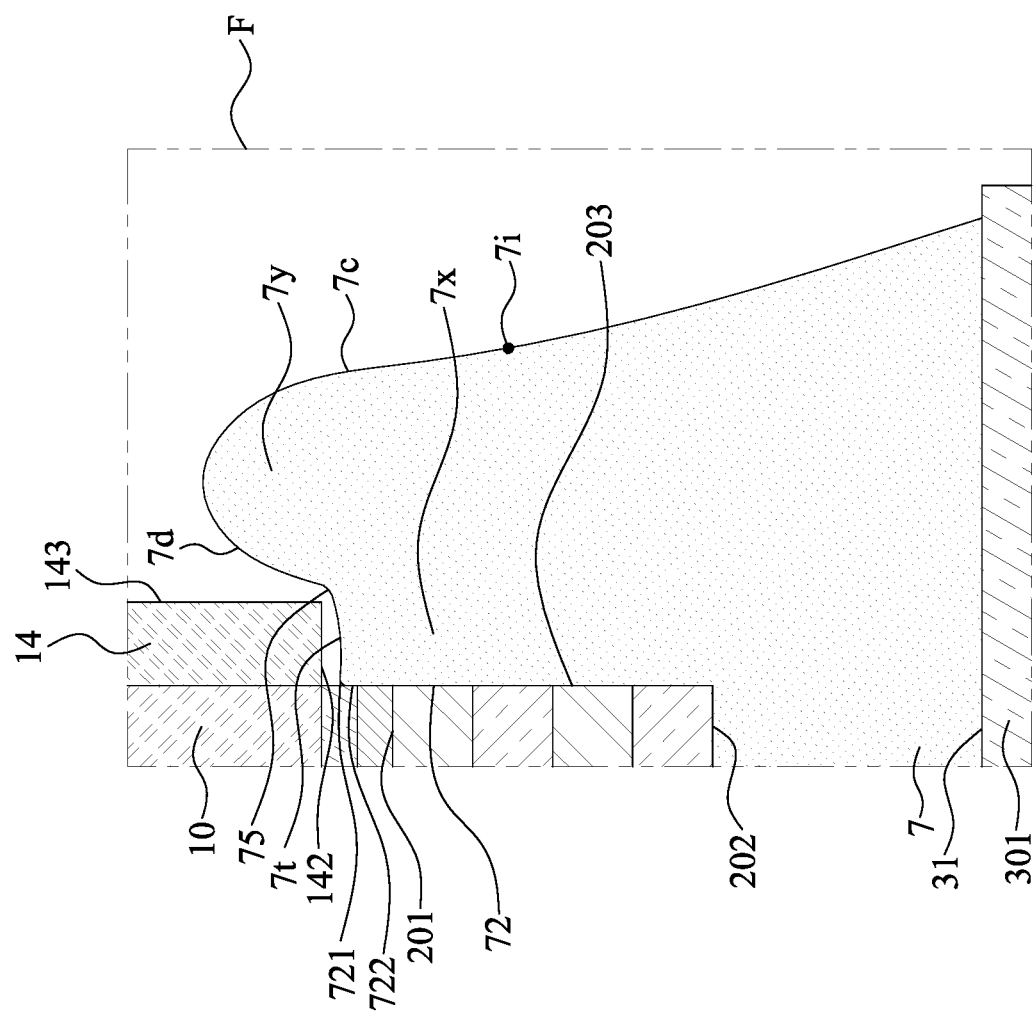
FIG. 38A is a partially enlarged view of a region "F" in FIG. 38.

FIG. 38 and FIG. 38A illustrate a method for manufacturing an electronic package according to some embodiments of the present disclosure. The initial stages of the illustrated process are the same as, or similar to, the stages illustrated in FIG. 14 to FIG. 17, and FIG. 22. FIG. 38 depicts a stage subsequent to that depicted in FIG. 22.

Referring to FIG. 38, the repelling layer 14 that is disposed on the release layer 12 and the seed layer 13 may be removed. Then, the second circuit structure 2 may be attached to or bonded on a first circuit structure 3 by a flip chip (FC) bonding through the first connecting elements 5. Then, a first underfill 7 may be formed between the first circuit structure 3 and the second circuit structure 2. The first underfill 7 formed on the first circuit structure 3 may be performed subsequent to bonding the second circuit structure 2 to the first circuit structure 3.

FIG. 38A is a partially enlarged view of a region "F" in FIG. 38. Referring to FIG. 38A, The first portion 7x (e.g., the inner portion) of the first underfill 7 may have an inner lateral surface 72 adjacent to and substantially conformal with the lateral surface 203 of the second circuit structure 2. A portion 722 of the inner lateral surface 72 may extend beyond the surface 201 of the second circuit structure 2, as shown in FIG. 11.

Afterwards, the temporary carrier 10 along with the repelling layer 14, the release layer 12, and the seed layer 13 may be removed, and an electronic device 1 may be attached to or bonded on the second circuit structure 2 through a plurality of second connecting elements 4. Then, a second underfill 6 may be formed between the electronic device 1 and the second circuit structure 2 to form an electronic package similar to the electronic package 100 as illustrated in FIG. 1 and FIG. 11.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:
    a low-density circuit structure;
    a high-density circuit structure disposed over the low-density circuit structure;
    a first underfill disposed over the low-density circuit structure, and extending along a lateral surface of the high-density circuit structure; and
    a polymer layer disposed on the lateral surface of the high-density circuit structure, and spaced apart from the first underfill,
    wherein the high-density circuit structure comprises a circuit layer including an inner via, and the inner via tapers away from the low-density circuit structure,
    wherein in a cross section, the polymer layer has a first bottom surface facing the low-density circuit structure, and the high-density circuit structure has a second bottom surface facing the low-density circuit structure and a circuit layer including a portion protruding beyond the second bottom surface, wherein the portion of the circuit layer has a bottom surface facing the low-density circuit structure and a lateral surface connecting the bottom surface of the portion of the circuit layer, wherein the first underfill contacts the lateral surface of the portion of the circuit layer, wherein the first bottom surface of the polymer layer and an inner portion of the first underfill under the first bottom surface collectively define a gap overlapping the lateral surface of the portion of the circuit layer in a first direction parallel with a top surface of the low-density circuit structure.

2. The electronic package of claim 1, wherein the first underfill is disposed on the top surface of the low-density circuit structure, wherein in the cross section, the polymer layer overlaps the first underfill in the first direction, and a distance between the polymer layer and the first underfill in the first direction gradually decreases toward the low-density circuit structure along a second direction perpendicular to the top surface of the low-density circuit structure.

3. The electronic package of claim 2, wherein the first underfill includes a step portion disposed under the polymer layer and having a top surface facing the first bottom surface of the polymer layer, wherein in the cross section, the top surface of the step portion has a first point and a second point closer to the lateral surface of the high-density circuit structure than the first point is, and wherein a second distance between the second point and the first bottom surface of the polymer layer in the second direction is less than a first distance between the first point and the first bottom surface in the second direction.

4. The electronic package of claim 3, wherein in the cross section, the top surface of the step portion further has a third point, and the first point is closer to the lateral surface of the high-density circuit structure than the third point is, and wherein a third distance between the third point and the first bottom surface of the polymer layer in the second direction is less than the first distance.

5. The electronic package of claim 4, wherein in the cross section, the first underfill has a top end, and a fourth distance between the top end of the first underfill and the polymer layer in the first direction is greater than the first distance.

6. The electronic package of claim 1, wherein in the cross section, the first underfill has a top end, the polymer layer further has a first top surface opposite to the first bottom surface, and wherein a first level of the top end of the first underfill is closer to a second level of the first bottom surface of the polymer layer than is a third level of the first top surface of the polymer layer with respect to the top surface of the low-density circuit structure.

7. The electronic package of claim 6, wherein a topmost circuit layer of the circuit layer of the high-density circuit structure is exposed by a top surface of the high-density circuit structure, and wherein in the cross section, the topmost circuit layer of the circuit layer of the high-density circuit structure does not overlap the first underfill in the first direction.

8. The electronic package of claim 7, wherein a thickness of the topmost circuit layer is greater than a thickness of the inner via, and a width of the topmost circuit layer is greater than a width of the inner via.

9. An electronic package, comprising:
a first circuit structure;
a second circuit structure disposed over the first circuit structure and comprising an inner via tapering away from the first circuit structure;
a first underfill disposed on a top surface of the first circuit structure and encapsulating the second circuit structure;
a semiconductor device disposed over the second circuit structure;
a second underfill disposed over the second circuit structure and encapsulating the semiconductor device; and
a polymer layer disposed on the second circuit structure, wherein in a cross section, an entirety of the polymer layer does not overlap the second underfill along a first direction perpendicular to the top surface of the first circuit structure,
wherein in the cross section, a left edge of the second underfill is recessed from a left edge of the first underfill, and a right edge of the second underfill is recessed from a right edge of the first underfill,
wherein the second underfill has a contact surface in contact with a top surface of the second circuit structure, wherein in the cross section, an elevation of a top surface of the polymer layer is not higher than an elevation of the contact surface of the second underfill with respect to the top surface of the first circuit structure, and is higher than an elevation of a top end of the first underfill spaced apart from the polymer layer with respect to the top surface of the first circuit structure.

10. The electronic package of claim 1, wherein the gap does not overlap a second underfill disposed over the high-density circuit structure in a second direction perpendicular to the top surface of the low-density circuit structure.

11. The electronic package of claim 9, wherein in the cross section, the first underfill does not overlap the second underfill in a second direction parallel with the top surface of the first circuit structure.

12. The electronic package of claim 11, wherein in the cross section, the first underfill includes a first portion overlapping the second underfill in the first direction and a second portion free from overlapping the second underfill in the first direction, wherein the second portion of the first underfill is disposed under and spaced apart from the polymer layer.

13. An electronic package, comprising:
a first circuit structure;
a second circuit structure disposed over the first circuit structure and comprising an inner via tapering away from the first circuit structure;
a first underfill disposed on a top surface of the first circuit structure and encapsulating the second circuit structure;
a semiconductor device disposed over the second circuit structure;
a second underfill disposed over the second circuit structure and encapsulating the semiconductor device; and
a polymer layer disposed on the second circuit structure, wherein in a cross section, an entirety of the polymer layer does not overlap the second underfill along a first direction perpendicular to the top surface of the first circuit structure,
wherein in the cross section, a left edge of the second underfill is recessed from a left edge of the first underfill, and a right edge of the second underfill is recessed from a right edge of the first underfill,
wherein in the cross section, the second circuit structure has a lateral surface including a first region a second region, and a third region, wherein the first region is encapsulated by the polymer layer, and the third region is encapsulated by the first underfill, and wherein the second region is exposed by the first underfill and the polymer layer, and wherein the second region faces and is spaced apart from a top surface of the first underfill.

14. The electronic package of claim 13, wherein in the cross section, a length of the third region is shorter than a length of the second region.

* * * * *